(12) United States Patent
Hirai et al.

(10) Patent No.: US 11,053,593 B2
(45) Date of Patent: Jul. 6, 2021

(54) COPPER OR COPPER ALLOY ARTICLE COMPRISING SURFACE-MODIFIED POLYESTER-BASED RESIN AND MANUFACTURING METHOD

(71) Applicant: ADVANCED TECHNOLOGIES, INC., Gotenba (JP)

(72) Inventors: Kinji Hirai, Kawasaki (JP); Isamu Akiyama, Yokohama (JP); Tsukasa Takahashi, Gotenba (JP); Takutaka Sugaya, Gotenba (JP); Yuka Muto, Gotenba (JP)

(73) Assignee: ADVANCED TECHNOLOGIES, INC., Gotenba (JP)

( * ) Notice: Subject to any disclaimer, the term of this patent is extended or adjusted under 35 U.S.C. 154(b) by 0 days.

(21) Appl. No.: 16/072,597

(22) PCT Filed: Jan. 12, 2017

(86) PCT No.: PCT/JP2017/000855
§ 371 (c)(1),
(2) Date: Jul. 25, 2018

(87) PCT Pub. No.: WO2017/130721
PCT Pub. Date: Aug. 3, 2017

(65) Prior Publication Data
US 2019/0078213 A1 Mar. 14, 2019

(30) Foreign Application Priority Data
Jan. 27, 2016 (JP) .............................. JP2016-013477

(51) Int. Cl.
*B32B 15/09* (2006.01)
*C23C 22/05* (2006.01)
(Continued)

(52) U.S. Cl.
CPC .............. *C23C 22/52* (2013.01); *B29C 65/02* (2013.01); *B29C 65/48* (2013.01); *B29C 66/026* (2013.01);
(Continued)

(58) Field of Classification Search
CPC ......... C23C 22/05; C23C 22/52; B29C 66/71; B29C 66/026; B29C 66/1122;
(Continued)

(56) References Cited

U.S. PATENT DOCUMENTS 9,790,242 B2  10/2017  Mori et al.
10,385,076 B2  8/2019  Mori et al.
(Continued)

FOREIGN PATENT DOCUMENTS

JP         5-39295 A     2/1993
JP       2004-25835 A    1/2004
(Continued)

OTHER PUBLICATIONS

International Search Report with English language translation and Written Opinion issued in International Application No. PCT/JP2017/000855 dated Feb. 28, 2017.
(Continued)

*Primary Examiner* — Lois L Zheng
(74) *Attorney, Agent, or Firm* — Foley & Lardner LLP

(57) ABSTRACT

Disclosed is a copper alloy article including: a substrate 10 made of a copper alloy; a polyester-based resin body 40; and a compound layer 20 for bonding the substrate 10 and the polyester-based resin body 40, wherein the compound layer 20 contains; a compound having a nitrogen-containing functional group and a silanol group, and an alkane type amine-based silane coupling agent.

13 Claims, 15 Drawing Sheets

(51) Int. Cl.
*C23C 22/52* (2006.01)
*B29C 65/48* (2006.01)
*B32B 15/20* (2006.01)
*H05K 3/38* (2006.01)
*B29C 65/00* (2006.01)
*B29C 65/02* (2006.01)
*C23C 26/00* (2006.01)
*H05K 1/03* (2006.01)

(52) U.S. Cl.
CPC .......... *B29C 66/1122* (2013.01); *B29C 66/41* (2013.01); *B29C 66/71* (2013.01); *B29C 66/74281* (2013.01); *B29C 66/91935* (2013.01); *B32B 15/09* (2013.01); *B32B 15/20* (2013.01); *C23C 22/05* (2013.01); *C23C 26/00* (2013.01); *H05K 1/03* (2013.01); *H05K 3/389* (2013.01); *B29C 66/929* (2013.01); *H05K 2203/124* (2013.01)

(58) Field of Classification Search
CPC .............. B29C 66/41; B29C 66/74281; B29C 66/91935; B29C 66/929
See application file for complete search history.

(56) References Cited

U.S. PATENT DOCUMENTS

| | | | |
|---|---|---|---|
| 2002/0132056 | A1 | 9/2002 | Montano et al. |
| 2005/0121229 | A1 | 6/2005 | Takai et al. |
| 2005/0214553 | A1 | 9/2005 | Yanetti et al. |
| 2007/0207337 | A1 | 9/2007 | Nagatani |
| 2008/0011612 | A1 | 1/2008 | Takai et al. |
| 2008/0214744 | A1 | 9/2008 | Tsuchida et al. |
| 2008/0277143 | A1 | 10/2008 | Takai et al. |
| 2009/0032287 | A1 | 2/2009 | Takai et al. |
| 2010/0065315 | A1* | 3/2010 | Kimura .................... B32B 15/08 174/258 |
| 2011/0003989 | A1 | 1/2011 | Tsuchida |
| 2011/0088933 | A1 | 4/2011 | Amou et al. |
| 2011/0189432 | A1* | 8/2011 | Goto .................... H05K 1/0373 428/141 |
| 2011/0217512 | A1 | 9/2011 | Heishi et al. |
| 2013/0183534 | A1 | 7/2013 | Mori et al. |
| 2014/0227539 | A1 | 8/2014 | Mori et al. |
| 2015/0152124 | A1 | 6/2015 | Mori et al. |
| 2016/0125971 | A1* | 5/2016 | Hasebe .................. C08K 3/013 174/268 |
| 2016/0152641 | A1 | 6/2016 | Mori et al. |
| 2017/0334933 | A1 | 11/2017 | Mori et al. |

FOREIGN PATENT DOCUMENTS

| | | |
|---|---|---|
| JP | 2005-262506 A | 9/2005 |
| JP | 2006-213677 A | 8/2006 |
| JP | 2007-262126 A | 10/2007 |
| JP | 2007-290003 A | 11/2007 |
| JP | 2008-031448 A | 2/2008 |
| JP | 2008-077930 A | 4/2008 |
| JP | 2008-174604 A | 7/2008 |
| JP | 2010-042564 A | 2/2010 |
| JP | 2010-131952 A | 6/2010 |
| JP | 2010-149389 A | 7/2010 |
| JP | 2010-280813 A | 12/2010 |
| JP | 2011-012002 A | 1/2011 |
| JP | 2011-91066 A | 5/2011 |
| JP | 2011-108848 A | 6/2011 |
| JP | 2012-35631 | 2/2012 |
| JP | 2014-025095 A | 2/2014 |
| JP | 2014-025099 A | 2/2014 |
| JP | 2014-027042 A | 2/2014 |
| JP | 2014-027053 A | 2/2014 |
| JP | 2015-116751 A | 6/2015 |
| JP | 6268370 B2 | 1/2018 |
| WO | WO-2012-046651 A1 | 4/2012 |
| WO | WO-2013-186941 A | 12/2013 |
| WO | WO 2014/196501 * 12/2014 .............. C08K 5/544 |

OTHER PUBLICATIONS

Japanese Patent Office, "Notification of Reasons for Refusal," issued in connection with Japanese Patent Application No. 2017-506437, dated Aug. 22, 2017.

Japanese Patent Office, "Decision to Grant Patent," issued in connection with Japanese Patent Application No. 2017-506437, dated Nov. 14, 2017.

International Preliminary Report on Patentability and translation dated Aug. 9, 2018 in corresponding application No. PCT/JP2017/000855.

Japanese Office Action dated Jul. 31, 2018 in corresponding application No. 2017-150288.

International Search Report dated Aug. 7, 2018 in corresponding application No. PCT/JP2018/018588.

British Office Action dated Sep. 17, 2018 in corresponding application GB. 1812224.2.

International Preliminary Report on Patentability issued in International Application No. PCT/JP2018/018588 dated Feb. 13, 2020 (24 pages).

Notice of Allowance for U.S. Appl. No. 16/635,660 dated Nov. 5, 2020.

* cited by examiner

COPPER OR COPPER ALLOY ARTICLE COMPRISING SURFACE-MODIFIED POLYESTER-BASED RESIN AND MANUFACTURING METHOD

RELATED APPLICATIONS

The present application claims priority under 37 U.S.C. § 371 to International Patent Application No. PCT/JP2017/000855, filed Jan. 12, 2017, which claims priority to and the benefit of Japanese Patent Application No. 2016-013477, filed on Jan. 27, 2016. The contents of these applications are hereby incorporated by reference in their entireties.

TECHNICAL FIELD

The present disclosure relates to a copper alloy article including a copper alloy in which a polyester-based resin member is bonded to at least a part of a surface thereof, and a polyester-based resin member suitable for manufacturing a copper alloy article, and a manufacturing method thereof.

Copper alloys have widely been used in electric and electronic components as rolled materials, expanded materials, foil materials and plating materials because of excellent electrical conductivity and thermal conductivity. Copper alloys are indispensable materials as wiring materials, and electronic circuit boards (printed wiring boards) in which a copper wiring and an insulating layer mainly made of a resin are composited are used in electronic devices. The printed wiring boards include rigid printed wiring boards using, as the material of an insulating layer, materials having no flexibility obtained by impregnating a glass fiber with a resin material such as an epoxy resin and curing the resin material, and flexible printed wiring boards (hereinafter referred to FPC) using, as the material of an insulating layer, thin flexible resin materials such as a polyimide film and a polyester film.

In any printed board, there is a need to increase the bonding force between the resin material and the copper wiring, and various techniques have been proposed. For example, there has been known a flexible copper clad laminate (FCCL) using, as the base material used for FPC, a material obtained by bonding a copper foil to one or both surfaces of a resin film. To improve the bonding strength between the resin film and the copper foil, there has been used a method in which a surface of the copper foil is roughened and an adhesive or a heated resin surface is adhered to irregularities of the roughened surface (anchor effect).

However, in high frequency signal, signal flows through a surface layer of the wiring due to the effect called the skin effect, so that if the surface of the copper foil has irregularities, the transmission distance becomes longer leading to increased transmission loss. Therefore, in the transmission loss which is an important characteristic of FPC, in order to achieve low transmission loss, it is required that the surface of the copper foil has high smoothness. Therefore, there is required a method capable of bonding a copper foil having a smooth surface and a resin material with high strength.

Patent Document 1 discloses a circuit board (multi-layered wiring board) in which, in a circuit board using a resin cured product as an insulating layer, in order to obtain high adhesion between a copper wiring layer having a particularly smooth surface and an insulating layer, a copper oxide layer present on a surface of the copper wiring layer is substituted or coated with an oxide and/or a hydroxide of other metals such as tin, zinc, chromium, cobalt and aluminum to form a layer of an amine-based silane coupling agent having a silanol group or a mixture thereof, which is covalently bonded to the oxide and hydroxide layers, and a vinyl-based silane coupling agent layer having a carbon-carbon unsaturated double bond is further formed thereon to form a covalent bond with a vinyl group contained in a resin cured article of the insulating layer.

There is disclosed, as the method for producing a circuit board, a method including the followings: a copper oxide layer on a copper surface is substituted or coated with a metal oxide layer and/or a hydroxide layer made of tin, zinc, chromium, cobalt and aluminum by plating, sputtering or vapor deposition; the metal oxide and hydroxide layers increase the adhesion between the silane coupling agent and the metal layer; the residual silanol group in the amine-based silane coupling agent layer and the silanol group of the vinyl-based silane coupling agent layer form a covalent bond; a carbon-carbon unsaturated double bond of the vinyl-based silane coupling agent forms a covalent bond with the vinyl compound in the insulating layer; and the resin cured article of the insulating layer is cured under pressure and heat.

This circuit board is complicated in configuration and complicated in production process.

Patent Document 2 discloses a flexible laminate in which a silane coupling agent is interposed between a base film of polyethylene naphthalate (PEN) which is a polyester-based resin and a conductive layer of copper. The patent document mentions that a hydrolyzable functional group of a silane coupling agent reacts with water to form a silanol group and bonds with metal such as copper, and an organic functional group is bonded to PEN by the reaction. There is also disclosed a lamination step in which a copper alloy is laminated on a base film coated with a silane coupling agent by a sputtering method, followed by subjecting to copper plating to form a conductive layer.

Patent Documents 3 to 6 disclose a material of copper or aluminum whose surface is not roughened, or a surface-treated metallic material in which a plated material obtained by subjecting the metallic material to silver, nickel or chromate plating is surface-treated with a silane or titanium coupling agent. The patent documents also disclose a method of producing a composite in which a liquid crystal polymer (hereinafter referred to as LCP) film having a polyester structure is pressure-bonded to the surface-treated metallic material or a polymer is bonded by injection molding. The patent documents mention that a coupling agent for a surface treatment of metal or a plated material thereof is preferably a coupling agent having a nitrogen-containing functional group, i.e., an amine-based silane or titanium coupling agent, which is effective because the coupling agent satisfactorily adheres to metals and has high peel strength (peeling strength).

Patent Document 7 discloses a surface treatment agent containing a novel amino group- and alkoxysilane group-containing triazine derivative compound. The patent document discloses that these materials can be bonded to each other by applying a surface treatment agent containing this novel compound to various metallic materials and polymer materials, followed by hot pressing. The patent document also mentions that, when the novel compound is surface-treated and coated with other reagents, a reaction between the functional group present in the film of the novel compound and other reagents occurs, thus being converted to a material having various functions.

PRIOR ART DOCUMENT

Patent Document

Patent Document 1: JP 2011-91066 A
Patent Document 2: JP 2010-131952 A
Patent Document 3: JP 2014-27042 A
Patent Document 4: JP 2014-27053 A
Patent Document 5: JP 2014-25095 A
Patent Document 6: JP 2014-25099 A
Patent Document 7: WO 2013/186941 A

DISCLOSURE OF THE INVENTION

Problems to be Solved by the Invention

When a polyester-based resin film, e.g., a liquid crystal polymer (LCP) is used as an insulating material for forming a printed wiring board, there is an advantage that the transmission loss of the high frequency signal transmission line can be reduced. However, when the polyester-based resin material and the copper wiring are bonded to each other with the silane coupling agent disclosed in Patent Documents 1 to 6, the reaction of the coupling agent may not proceed as expected due to the chemical structure of the polyester-based resin. Therefore, an error in bonding strength between the polyester-based resin material and the copper wiring may increase (i.e., inferior reproducibility of the bonding strength), leading to a decrease in bonding strength.

Since the novel compound disclosed in Patent Document 7 has an amino group and an alkoxysilane group introduced into a triazine ring, when a surface treatment agent containing the compound is used, the chemical bondability between the metal and resin increases as compared with the existing silane coupling agent. However, there is required a method capable of obtaining higher bonding strength.

Thus, an object of the present disclosure is to provide a copper alloy article in which a polyester-based resin body and a copper alloy substrate are bonded to each other with sufficiently high bonding strength, and a method for producing thereof.

Means for Solving the Problems

The inventors of the present invention have intensively studied so to solve the above problems and found solution means with the following configurations, thus completing the present invention.

An aspect 1 of the present invention is directed to a copper alloy article including:
  a substrate made of a copper alloy;
  a polyester-based resin body; and
  a compound layer for bonding the substrate and the polyester-based resin body, wherein
    the compound layer contains;
    a compound having a nitrogen-containing functional group and a silanol group, and
    an alkane type amine-based silane coupling agent.

An aspect 2 of the present invention is directed to the copper alloy article according the aspect 1, wherein the nitrogen-containing functional group has a nitrogen-containing 5-membered or higher-membered cyclic structure.

An aspect 3 of the present invention is directed to the copper alloy article according to the aspect 2, wherein the 5-membered or higher-membered cyclic structure is a triazole or triazine structure.

An aspect 4 of the present invention is directed to the copper alloy article according to any one of the aspects 1 to 3, wherein the substrate has a surface roughness Ra of 0.1 µm or less.

An aspect 5 of the present invention is directed to the copper alloy article according to any one of the aspects 1 to 4, wherein the polyester-based resin body is made of a polyester-based resin selected from the group consisting of polyethylene terephthalate, polymethylene terephthalate, polybutylene terephthalate, polyethylene naphthalate, polybutylene naphthalate and a liquid crystal polymer.

An aspect 6 of the present invention is directed to the copper alloy article according to any one of the aspects 1 to 5, wherein an oxide layer and a rust preventive layer are absent on a surface of the substrate.

An aspect 7 of the present invention is directed to a polyester-based resin member including:
  a polyester-based resin body; and
  a compound layer provided on a surface of the polyester-based resin body, wherein
    the compound layer contains;
    a compound having a nitrogen-containing functional group and a silanol group, and
    an alkane type amine-based silane coupling agent.

An aspect 8 of the present invention is directed to the polyester-based resin member according to the aspect 7, wherein the nitrogen-containing functional group has a nitrogen-containing 5-membered or higher-membered cyclic structure.

An aspect 9 of the present invention is directed to the polyester-based resin member according to the aspect 8, wherein the 5-membered or higher-membered cyclic structure is a triazole or triazine structure.

An aspect 10 of the present invention is directed to the polyester-based resin member according to any one of the aspects 7 to 9, wherein the polyester-based resin body is made of a polyester-based resin selected from the group consisting of polyethylene terephthalate, polymethylene terephthalate, polybutylene terephthalate, polyethylene naphthalate, polybutylene naphthalate and a liquid crystal polymer.

An aspect 11 of the present invention is directed to copper alloy member including:
  a substrate made of a copper alloy; and
  a compound layer provided on a surface of the substrate, wherein
    the compound layer contains;
    a compound having a nitrogen-containing functional group and a silanol group, and
    an alkane type amine-based silane coupling agent.

An aspect 12 of the present invention is directed to the copper alloy member according to the aspect 11, wherein the nitrogen-containing functional group has a nitrogen-containing 5-membered or higher-membered cyclic structure.

An aspect 13 of the present invention is directed to the copper alloy member according to the aspect 12, wherein the 5-membered or higher-membered cyclic structure is a triazole or triazine structure.

An aspect 14 of the present invention is directed to a method for producing a polyester-based resin member including; a polyester-based resin body, and a compound layer provided on a surface of the polyester-based resin body, the method including:
  bringing a solution into contact with a surface of the polyester-based resin body, the solution containing; a compound having a nitrogen-containing functional group and a silanol group, and an alkane type amine-based silane coupling agent, and then heat-treating the polyester-based resin body.

An aspect 15 of the present invention is directed to a method for producing a copper alloy article including; a substrate made of a copper alloy, a polyester-based resin body, and a compound layer for bonding the substrate and the polyester-based resin body, the method including:

obtaining a polyester-based resin member by the method according to the aspect 14;

cleaning a surface of the substrate with an aqueous acid solution; and bonding the substrate and the polyester-based resin body by bonding the compound layer and the cleaned surface of the substrate.

An aspect 16 of the present invention is directed to a method for producing a copper alloy member including; a substrate made of a copper alloy, and a compound layer provided on a surface of the substrate, the method including:

cleaning the substrate with an aqueous acid solution, and bringing a solution into contact with a surface of the substrate, the solution containing; a compound having a nitrogen-containing functional group and a silanol group, and an alkane type amine-based silane coupling agent; and then heat-treating the substrate.

An aspect 17 of the present invention is directed to a method for producing a copper alloy article including; a substrate made of a copper alloy, a polyester-based resin body, and a compound layer for bonding the substrate and the polyester-based resin body, the method including:

obtaining a copper alloy member by the method according to the aspect 16; and bonding the substrate and the polyester-based resin body by bonding the compound layer and the polyester-based resin body.

An aspect 18 of the present invention is directed to the method according to any one of the aspects 14 to 17, wherein a molar concentration ratio of the compound having the nitrogen-containing functional group and the silanol group to the alkane type amine-based silane coupling agent in the solution is 1:0.5 to 1:15.

Effects of the Invention

According to the present invention, it is possible to bond a polyester-based resin body and a copper alloy substrate to each other with sufficient bonding strength through a compound layer containing two or more compounds.

MODE FOR CARRYING OUT THE INVENTION

The inventors of the present invention have found that when a compound layer for bonding a copper alloy substrate and a polyester-based resin body contains two types of compounds, the bonding strength can be increased as compared with the case where only one of the compounds is contained, thus completing the copper alloy article according to the present disclosure.

Specifically, as a first compound, a compound having both a nitrogen-containing functional group and a silanol group is used. As the second compound, an alkane type amine-based silane coupling agent is used. Namely, the present disclosure is directed to a copper alloy article in which a copper alloy substrate and a polyester-based resin body are bonded to each other through a compound layer interposed therebetween, the compound layer containing a first compound which has a nitrogen-containing functional group and a silanol group and a second compound which is an alkane type amine-based silane coupling agent.

Embodiments according to the present invention will be described below.

Embodiment 1

Figure 1:
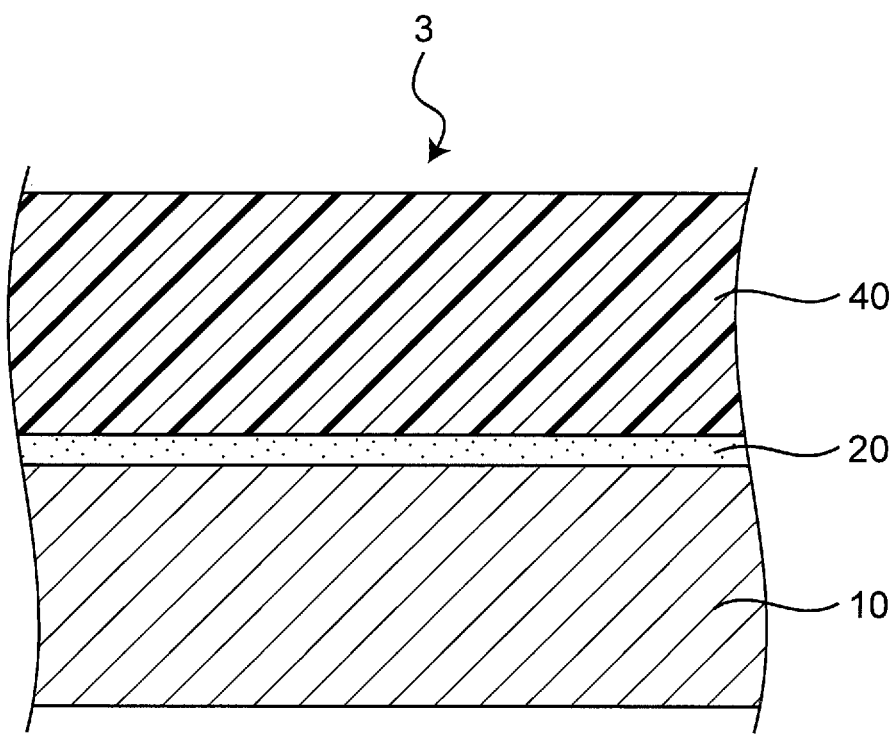
FIG. 1 is a schematic sectional view of a copper alloy article according to Embodiment 1 of the present invention.

FIG. 1 is a schematic sectional view of a copper alloy article 3 according to Embodiment 1, which includes a copper alloy substrate 10, a polyester-based resin main body 40 and a compound layer 20 disposed therebetween. The copper alloy substrate 10 and the polyester-based resin main body 40 are bonded to each other through the compound layer 20 interposed therebetween.

The copper alloy substrate 10 is made of pure copper or various copper alloys, and any copper alloy used industrially can be used as the copper alloy.

For the copper alloy substrate 10, for example, a copper foil such as an electrolytic copper foil or a rolled copper foil can be applied. In particular, a rolled copper foil having high flexibility is suitable for FPC.

The polyester-based resin body 40 is made of a polyester-based resin. The polyester-based resin is, for example, a polycondensate of a polyvalent carboxylic acid (dicarboxylic acid) and a polyalcohol (diol). Polyethylene terephthalate (PET), polymethylene terephthalate, polybutylene terephthalate, polyethylene naphthalate, polybutylene naphthalate and a liquid crystal polymer (LCP) are suitable.

For the polyester-based resin body 40, for example, a polyester-based resin film, a polyester-based resin plate or the like can be employed. In particular, an LCP film has low dielectric constant and low dielectric loss tangent in material properties, so that it has an advantage that the transmission loss of the high frequency signal line is reduced particularly when applied to FPC. Furthermore, since the LCP film has very low water absorption rate, it exhibits satisfactory dimensional stability even under high humidity.

As an example, detailed description will be made of a copper alloy article using a rolled copper foil as the copper alloy substrate 10 and using an LCP film as the polyester-based resin body. It is also possible to similarly configure and produce the copper alloy article 3 using the copper alloy substrate 10 and the polyester-based resin body 40 in other forms.

(1) Selection of Rolled Copper Foils

In Embodiments 1 and 2, in order to reduce the transmission loss of high frequency signals on the printed circuit board, the copper alloy substrate 10 preferably has a flat surface, for example, the surface roughness Ra is preferably 0.1 μm or less. In Embodiment 2 mentioned later, it is preferable that the copper alloy is exposed on the surface of the copper alloy substrate 10. Therefore, investigation is made of a selection method of the copper alloy substrate 10 suitable for any embodiment.

First, three types of commercially available copper foils (copper foils A to C) are selected for a copper foil having a thickness of 18 μm, which is most demanded by FPC, and measurement of the surface layer is performed by X-ray photoelectron spectroscopy (XPS)

TABLE 1

| Copper foil | Surface layer XPS analysis | Surface roughness (μm) $R_a$ | $R_z$ | Remarks |
|---|---|---|---|---|
| A | Zinc plating | — | 0.75 | Used in existing FCCL |
| B | Oxide, Rust preventive | 0.05 | 0.4 | Slight oil spots |
| C | Oxide, Rust preventive | 0.15 | — | Significant oil spots |

A copper foil A is used for existing FPC and, when measured by XPS, zinc was detected. Namely, it has been found that the copper foil A is galvanized. Since a copper foil having no plating layer is preferable as a copper foil suitable for Embodiment 2, the copper foil A was excluded.

Although there was no plating layer on the surface of the copper foils B and C, elements derived from oxidation of copper and the rust preventive applied to the copper foil surface (e.g., carbon, etc.) were detected.

With respect to these copper foils B and C, the measurement of the surface roughness and electron microscope (SEM) analysis of the surface were performed.

The surface roughness Ra was measured by a laser microscope. The copper foil B had Ra of 0.05 μm and the copper foil C had Ra of 0.15 μm.

As a result of confirming wrinkle-like dents (oil spots) on the surface by SEM observation, slight oil spots were observed in the copper foil B as compared with the copper foil C.

From these results, it was judged that the copper foil B had higher surface smoothness, and the copper foil B was used as the copper alloy substrate 10.

(2) Cleaning of Copper Foil (Copper Alloy Substrate 10)

A commercially available copper foil is coated with a rust preventive. On a surface of the copper foil, an oxide layer can be formed with passage of time. In the case of a copper alloy article such as FPC, in order to exhibit properties of the copper foil, for example, electric conductivity to the utmost, it is desired that the rust preventive and the oxide layer are removed from the surface of the copper foil to expose copper on the surface of the copper foil. In order to do that, there is a need to perform cleaning (acid cleaning) to remove the rust preventive and the oxide layer before using the copper foil. Therefore, using the copper foil B as a sample, the conditions of acid cleaning were investigated.

As a cleaning solution, 15% sulfuric acid and 1% hydrochloric acid were used at room temperature. The sample was immersed in a cleaning solution for 0 minute (without cleaning), 1 minute and 5 minutes, taken out from the cleaning solution, sufficiently washed with ion exchanged water, and then dried. Thereafter, the surface of the sample was analyzed by XPS to determine the cleaning level.

The cleaning level of the copper foil surface after acid washing was judged whether or not the rust preventive remains on the surface. Specifically, the copper foil surface after cleaning was measured by XPS and qualitatively judged according to the presence or absence of a peak of nitrogen (N) (peak of nitrogen N1s orbit at binding energy of around 400 eV) derived from the rust preventive. The case where a peak attributed to nitrogen (N) could be confirmed in the XPS spectrum was judged to be "present", whereas, the case where a peak could not be confirmed was judged to be "none". The measurement results are shown in Table 2.

The oxide layer can also be used as evaluation criteria for the cleaning level. However, even if the oxide layer can be completely removed from the surface of the copper foil by acid cleaning, copper on the copper foil surface reacts with oxygen in the atmosphere to form a trace amount of an oxide at the moment when the copper foil is taken out from the cleaning solution. In surface analysis by XPS, the trace amount of the oxide is also detected, so that it is difficult to accurately judge the cleaning level.

TABLE 2

| | Immersion time | | |
|---|---|---|---|
| Cleaning solution | 0 minute | 1 minutes | 5 minutes |
| 15% Sulfuric acid | Present | None | None |
| 1% Hydrochloric acid | Present | None | None |

As shown in Table 2, in the case of any cleaning solution (aqueous acid solution), the peak derived from the nitrogen N1s orbital disappeared from the copper foil surface within the immersion time of 1 minute, leading to a minor peak of the Cu2p orbital derived from the oxide. Therefore, it was judged that the rust preventive and the oxide adhered to the copper foil can be removed by immersing in the cleaning solution for 1 minute. In the following embodiments, a copper foil cleaned with 1% hydrochloric acid for 1 minute, which is easy to handle, is used.

Even in the copper alloy article using the copper foil, it can be seen that a copper foil cleaned with an acid was used by XPS analysis of the surface of the copper foil peeled off from the copper alloy article, thereby confirming the peak derived from the N1s orbital and the peak derived from the Cu 2p orbital. It is possible to confirm that no rust preventive is present since the peak derived from the N is orbit is not detected. It is possible to confirm that no oxide layer is present due to minor peak derived from the Cu 2p orbital (e.g., a peak intensity of 1/10 or less of the peak intensity of a peak derived from Cu—O present at around 935 eV, particularly a peak intensity of ¹/₂₀ or less). As mentioned above, even if the copper foil is cleaned with an acid to remove the oxide layer, a small amount of the oxide is formed by extracting into the atmosphere thereafter. However, since such a trace amount of the oxide does not substantially affect properties of the copper foil (in particular, the bonding force with the polyester-based resin body), it is considered that there is substantially no oxide layer.

(3) Compound Layer

The compound layer 20 contains two types of compounds, a first compound having a nitrogen-containing functional group and a silanol group, and a second compound which is an alkane type amine-based silane coupling agent. Both compounds can be used alone as a silane coupling agent. In the present disclosure, it has been found that the bonding strength can be increased as compared with the case where these compounds are used alone by using a bulky first compound and a linear second compound in combination.

The nitrogen-containing functional group is effective for increasing the bonding strength to the copper alloy substrate 10 because of its high chemical adsorptivity to copper. The silanol group is effective for increasing the bonding strength to the polyester-based resin body 40 because of its high chemical adsorptivity to the ester structure of the polyester-based resin. Therefore, the compound having a nitrogen-containing functional group and a silanol group (first compound) is suitable for bonding the copper alloy substrate 10 and the polyester-based resin body 40 to each other.

The inventors of the present invention have found for the first time that, when a linear silane coupling agent (second compound) is allowed to coexist with the first compound mentioned above, it is possible to increase the bonding strength between the copper alloy substrate 10 and the polyester-based resin body 40. The reason why such effect is obtained is not clear, but is considered to be due to the following mechanism.

The second compound, which is an alkane type amine-based silane coupling agent, has comparatively low bulky structure (e.g., a linear structure). In general, the first compound having a nitrogen-containing functional group and a silanol group has a bulky structure as compared with the linear second compound. Therefore, in a situation where only the first compound is present, it is difficult for first compounds to come close to each other. Since the second compound can penetrate into the space between the bulky first compounds, the density of the compound in the compound layer 20 can be increased. Thereby, when the polyester-based resin body 40 and the copper alloy substrate 10 are bonded to each other through the compound layer 20 interposed therebetween, the bonding strength can be increased.

Therefore, when bonding is performed using the first compound which coexists with the second compound, it is possible to improve the bonding strength between the copper alloy substrate 10 and the polyester-based resin body 40 as compared with the case where bonding is performed using the first compound or the second compound alone.

In this way, by using two types of compounds having different structures in combination, it is possible to roughen each surface of the copper alloy substrate 10 and the polyester-based resin body 40, or to firmly bond the copper alloy substrate 10 and the polyester-based resin body 40 to each other without forming a metal oxide layer on the surface of the copper alloy substrate.

The "nitrogen-containing functional group" possessed by the first compound preferably has a nitrogen-containing 5-membered or higher-membered cyclic structure. The nitrogen-containing 5-membered or higher-membered cyclic structure can be, for example, a triazole or triazine structure.

Since the structure of the first compound becomes particularly bulky in the case of having the 5-membered or higher-membered cyclic structure, it becomes difficult for the first compounds to come closer to each other, thus exerting more remarkable effect of improving the bonding strength due to mixing of the second compound.

It is possible to confirm by a method of analysis such as XPS analysis that the compound layer contains a first compound and a second compound. For example, in the spectrum obtained by the XPS analysis of the compound layer, a peak attributed to the nitrogen atom bonded by a double bond, a peak attributed to the nitrogen atom of a primary amino group, a peak attributed to the nitrogen atom of a secondary amino group and the like are included within a range of the binding energy at which an N1s peak appears. These peaks can be identified by an analysis spectrum of an XPS spectrum.

When the nitrogen atom contained in the first compound and the nitrogen atom contained in the second compound are in different bonding states, and thus the peaks of the XPS spectrum attributed to those nitrogen atoms are identifiable. Thus, it is possible to specify that the first compound and the second compound are contained in the compound layer.

Selection of Compound

Hereinafter, the bonding strength between various compounds and the copper alloy substrate was compared.

Five types of compounds shown in Table 3 (hereinafter, each compound is referred to as the symbol mentioned in Table 3) were selected. Regarding the compound whose chemical name is disclosed, the chemical name was described. Meanwhile, regarding the compound ImS which is not disclosed in detail, the disclosed basic structure was described. Main functional groups possessed by these compounds are shown in Table 4. It is known that an alkoxysilane group converted into a silanol group in an aqueous solution. Among them, only the compound ET has no alkoxysilane group and is not a silane coupling agent.

TABLE 3

| Symbol | Compound | Manufacturer Product name |
|---|---|---|
| ET | 1,3,5-Tris-(2,3-epoxypentyl)-1,3,5-triazine-2,4,6(1H,3H,5H)trione | Nissan Chemical Industries, Ltd. TEPIC-VL |
| AST | 2-(3-Triethoxysilylpropyl)amino-4,6-di(2-aminoethyl)amino-1,3,5-triazine | Sulfur Chemical Laboratory Inc. |
| ImS | Imidazole-based silane compound | JX Nippon Mining & Metals Corporation IS-1000 |
| AAS | N-2(aminoethyl)-3-aminopropyltrimethoxysilane | Shin-Etsu Chemical Co., Ltd. KBM-603 |
| AS | 3-Aminopropyltrimethoxysilane | Shin-Etsu Chemical Co., Ltd. KBM-903 |

TABLE 4

| Symbol | Compound | Main functional group |
|---|---|---|
| ET | 1,3,5-Tris-(2,3-epoxypentyl)-1,3,5-triazine-2,4,6(1H,3H,5H)trione | Basic structure: 6-Membered triazine ring Epoxy group Oxo group |

TABLE 4-continued

| Symbol | Compound | Main functional group |
|---|---|---|
| AST | 2-(3-Triethoxysilylpropyl)amino-4,6-di(2-aminoethyl)amino-1,3,5-triazine | Basic structure: 6-Membered triazine ring<br>Alkoxysilane group<br>Amino group |
| ImS | Imidazole-based silane compound | Basic structure: 5-Membered imidazole ring<br>Alkoxysilane group |
| AAS | N-2(aminoethyl)-3-aminopropyltrimethoxysilane | Basic structure: Alkane<br>Alkoxysilane group<br>Amino group |
| AS | 3-Aminopropyltrimethoxysilane | Basic structure: Alkane<br>Alkoxysilane group<br>Amino group |

A copper foil, an LCP film (Vecstar CT-Z, manufactured by Kuraray Co., Ltd.) and a PET film (UF, manufactured by Teijin DuPont Films), which were cleaned with 1% hydrochloric acid for 1 minute and then sufficiently washed with ion exchanged water, were coated with five types of aqueous bonding compound solutions each having a concentration of 0.1% using a dip coater manufactured by J.P.C Co., Ltd., followed by drying and further heat treatment at 100° C. for 5 minutes. The coated surface was analyzed by XPS analysis. The analysis results are summarized in Table 7. Regarding the PET film, only ET coating and AST coating were performed.

TABLE 5

| | XPS analysis results | | |
|---|---|---|---|
| Symbols | Copper foil | LCP film | PET film |
| ET | Cu2p orbital peak: only Cu (0-valent) peak exists at around 930-935 eV, and no Cu—N peak exists. Physical adsorption | C1s orbital peak: no chemical shift exists in C—O/C=O peaks at 286-288 eV. | C1s orbital peak: no chemical shift exists in C—O/C=O peaks at 286-288 eV. |
| AST | Cu2p orbital peak: Cu—N bond peak exists at around 936 eV, and no Cu (0-valent) peak exists. | C1s orbital peak: chemical shift exists in C—O/C=O peaks at 286-288 eV | C1s orbital peak: chemical shift exists in C—O/C=O peaks at 286-288 eV |
| ImS | Cu2p orbital peak: Cu (0-valent) exists, and Cu—N bond peak exists at around 936 eV. | C1s orbital peak: chemical shift exists in C—O/C=O peaks at 286-288 eV. Unreacted ester group exists at 289 eV. | |
| AAS | Cu2p orbital peak: Cu (0-valent) exists, and Cu—N bond peak exists at around 936 eV. | C1s orbital peak: chemical shift exists in C—O/C=O peaks at 286-288 eV. Unreacted ester group exists at 289 eV. | |
| AS | Cu2p orbital peak: Cu (0-valent) peak is high, and Cu—N bond peak exists at around 936 eV. | C1s orbital peak: chemical shift exists in C—O/C=O peaks at 286-288 eV. Unreacted ester group exists at 289 eV. | |

Compound ET

A compound ET is a compound having a nitrogen-containing functional group and a silanol group (i.e., first compound), and the compound ET has three epoxy groups and three oxo groups (C=O) in a 6-membered triazine ring containing three nitrogen atoms (N). In the copper foil coated with ET, a peak showing chemical adsorption between copper (Cu) and the N atom did not appear. In LCP and PET coated with ET, there is no chemical shift of the peak showing chemical adsorption with the epoxy group. These results revealed that ET does not chemically adsorbed to each surface of a copper foil, LCP and PET, and is only physically adsorbed.

Compound AST

A compound AST is a compound having a nitrogen-containing functional group and a silanol group (i.e., first compound), and the compound AST has one alkoxysilane group and two amino groups in a 6-membered triazine ring containing three nitrogen atoms. In the copper foil coated with AST, when observing the Cu 2p orbital peak of copper, a peak showing bonding between Cu and N was confirmed. In LCP and PET coated with AST, peaks showing C—O/C=O bonds appeared at 286 to 288 eV of the C1s orbital peak, and both peaks shifted from the peak position of the original film. These results revealed that, regarding AST, N of the 6-membered triazine ring and N of the amino group are chemically adsorbed to copper and the silanol group is chemically adsorbed to the ester structure of LCP and PET.

Compound ImS

A compound ImS is a compound having a nitrogen-containing functional group and a silanol group (i.e., first compound), and has a structure in which a 5-membered imidazole ring and one alkoxysilane group are connected to each other. In the copper foil coated with ImS, when observing the Cu 2p orbital peak of copper, there was a peak showing bonding between Cu and N, which shows that the imidazole group is chemically adsorbed to copper. At the same time, there was also a peak of Cu (0-valent), which shows that there is a part where no ImS is present on the surface of copper. In AST, the peak of Cu (0-valent) was not observed, which showed that AST is chemically adsorbed to the copper surface at higher density than that of ImS.

Meanwhile, in LCP coated with ImS, the peak showing bonding of C—O and C=O at 286 to 288 eV shifted from the peak position of the original film, which showed that chemical adsorption occurs. There was also a peak of the unreacted ester group at 289 eV, which showed that there was a portion where ImS is not chemically adsorbed to the LCP. In AST, since the peak of such unreacted ester group was not observed, it is judged that AST is higher in chemical adsorptivity to the ester structure of LCP than that of ImS.

Compounds AAS and AS

Compounds AAS and AS are alkane type amine-based silane coupling agents (i.e., second compound), and are typical compounds which are widely applied for bonding between copper and resins in the prior art document. In the copper foil coated with these compounds, when observing the Cu 2p orbital peak of copper, there is a Cu (0-valent) peak like ImS, which showed that there is the portion where AAS or AS is not adsorbed on the surface of copper. Heretofore, a number of documents have addressed that the silanol group is chemically adsorbed to the copper surface. However, it became clear that, unlike the documents, the chemical adsorptivity of these compounds deteriorate on the copper surface cleaned sufficiently with an acid As mentioned previously, when the copper surface is cleaned with an acid until the antioxidant applied thereon is completely removed, the oxide of copper formed on the surface by being exposed to the natural environment is also removed, leading to drastic decrease in amount thereof. With regard to the silanol group chemically adsorbed to the oxide, adsorption sites have been markedly reduced on the surface of copper cleaned sufficiently with an acid. Meanwhile, since the Cu—N bond peak is observed, the amino group is chemically adsorbed on the copper foil surface. At the same time, the peak of Cu (0-valent) attributed to the copper surface, on which no compound is adsorbed, also appeared, which showed that the amino group of an alkane has low chemical absorptivity.

In LCP coated with AAS and AS, there is a peak of the unreacted ester group at 289 eV, and it is judged that the chemical adsorptivity to LCP is also low.

The substituent of the nitrogen-containing cyclic compound may be, in addition to the amino group of AST, a ureido group, an isocyanate group or the like.

Specification of Compound Contained in Compound Layer

A relationship between each compound and the XPS spectrum was examined using ImS as the first compound and using AAS as the second compound.

An aqueous solution containing a predetermined compound was applied to an LCP film and then heat-treated at 100° C. for 5 minutes. The film of the compound formed on the surface of the LCP film was subjected to XPS analysis.

Figure 2:
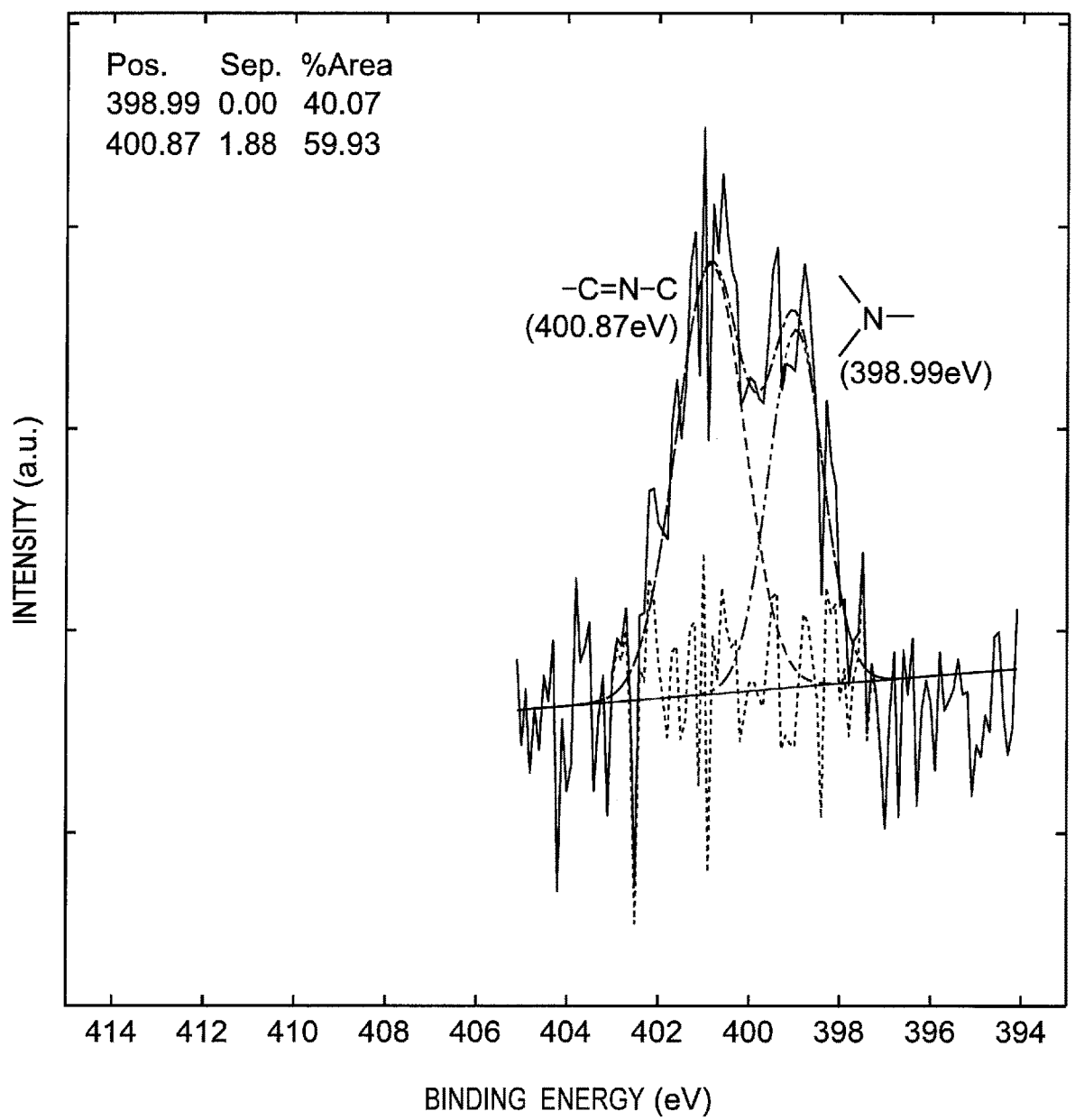
FIG. 2 is an XPS spectrum of an LCP film surface coated with ImS.

FIG. 2 shows an N1s peak of an XPS spectrum of the ImS film, and the spectrum is separated into two spectra by analysis software of the XPS spectrum.

The first peak appearing at the position of the binding energy of 400.87 eV is attributed to a nitrogen atom bonded by a double bond contained in the 5-member imidazole ring (labeled with "—C=N—C" in FIG. 2).

The second peak appearing at the position of the binding energy of 398.99 eV is attributed to an amino type nitrogen atom (labeled ">N—" in FIG. 2) contained in the 5-membered imidazole ring.

The intensity of the second peak is almost the same as that of the first peak.

Figure 3:
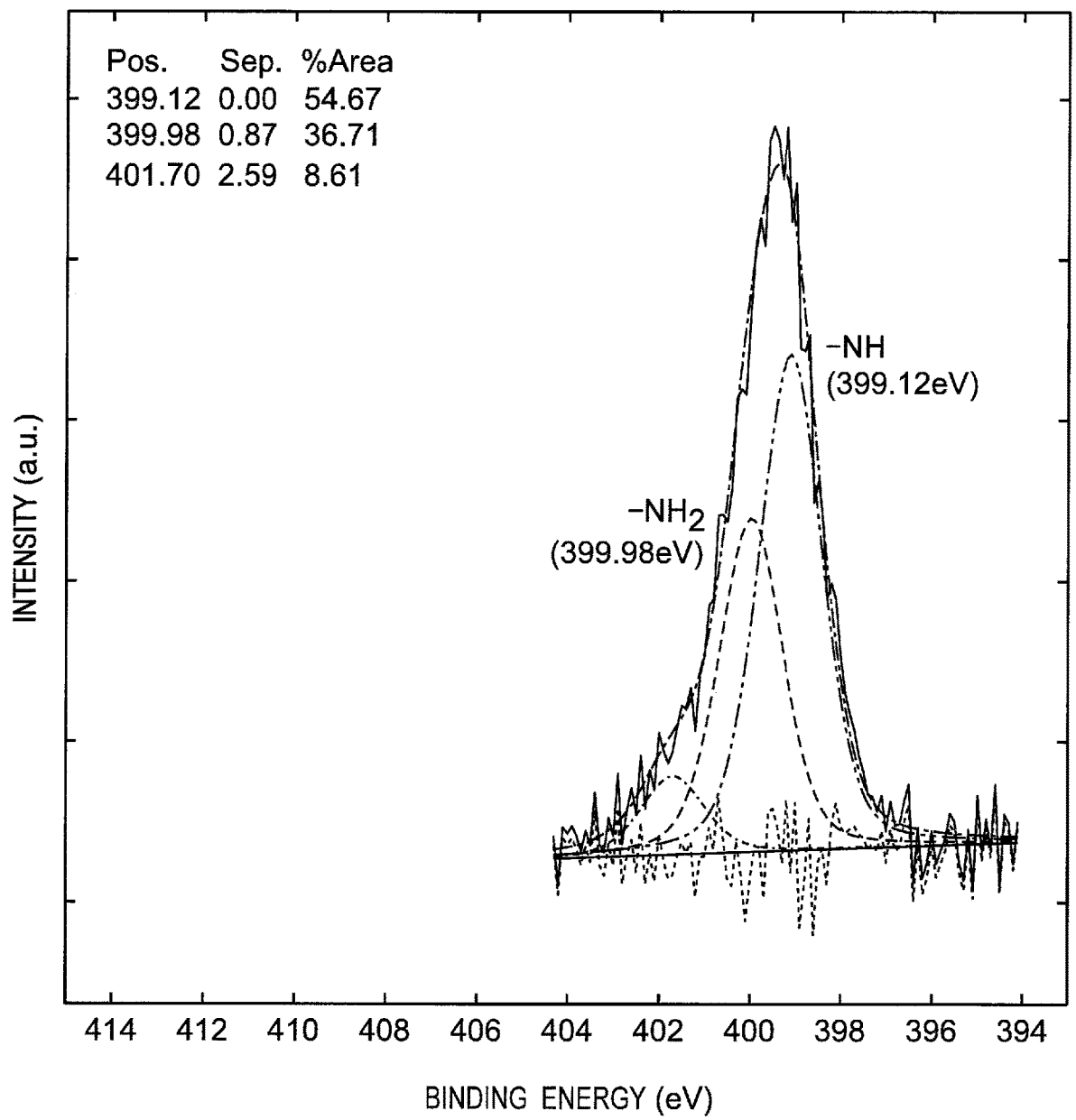
FIG. 3 is an XPS spectrum of an LCP film surface coated with AAS.

FIG. 3 shows an N1s peak of an XPS spectrum of the AAS film, and the spectrum is separated into three spectra by analysis software.

The peak appearing at the position of the binding energy of 399.98 eV is attributed to a nitrogen atom of a primary amino group (labeled with "—NH$_2$" in FIG. 3).

The peak appearing at the position of the binding energy of 399.12 eV is attributed to a nitrogen atom of a secondary amino group (labeled with "—NH" in FIG. 3).

Figure 4:
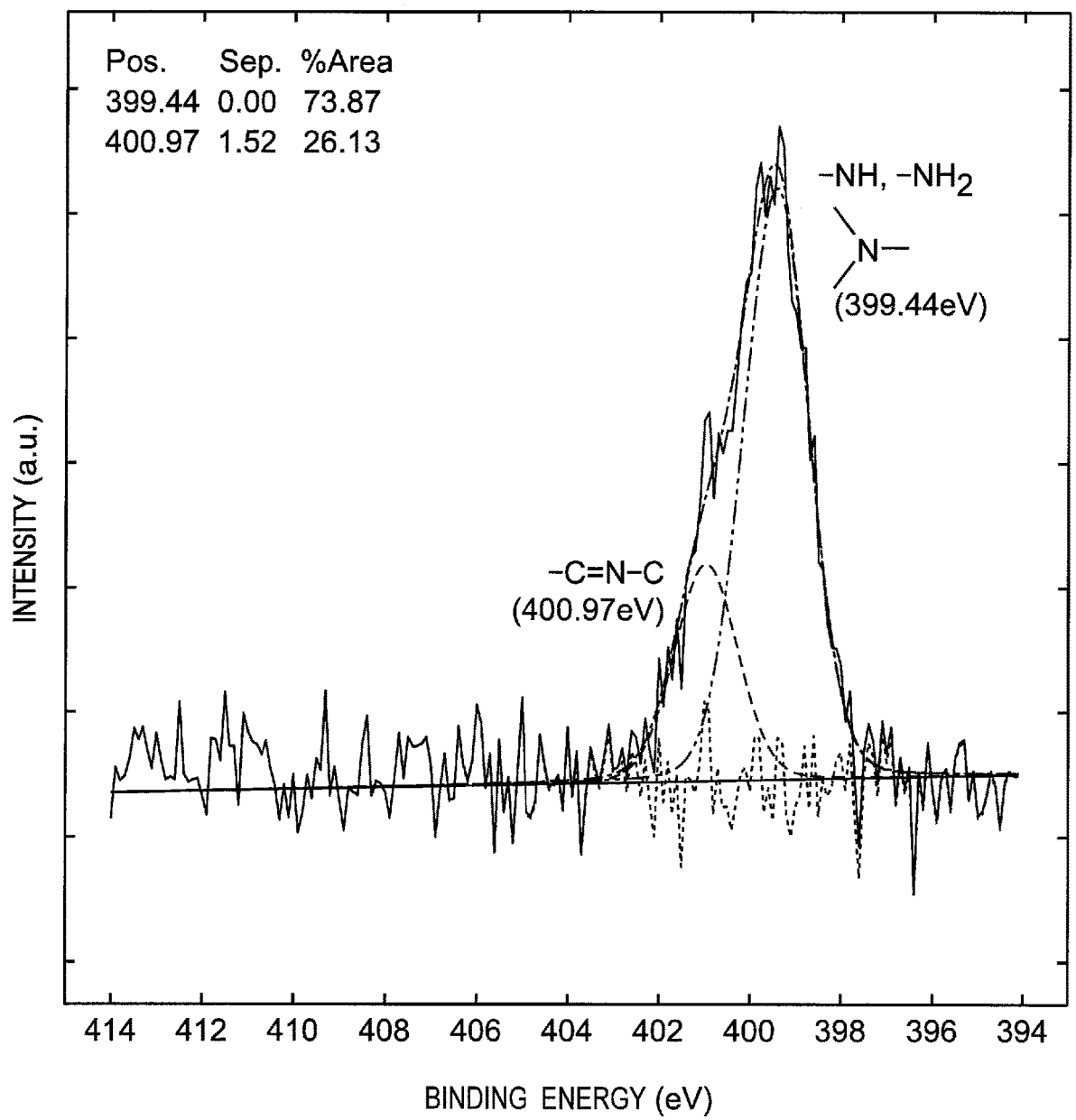
FIG. 4 is an XPS spectrum of an LCP film surface coated with a mixture ImS and AAS.

FIG. 4 shows an N1s peak of an XPS spectrum of the film containing ImS and AAS, and the spectrum is separated into two spectra by analysis software.

The first peak appearing at the position of the binding energy of 400.97 eV is attributed to a nitrogen atom bonded by a double bond contained in the 5-member imidazole ring (labeled with "—C=N—C" in FIG. 4). Since this peak is present, it can be seen that ImS is contained in the film of the measured compound.

Regarding the second peak appearing at the position of the binding energy of 399.44 eV, a peak attributed to an amino type nitrogen atom (labeled with ">N—" in FIG. 4), a peak attributed to a nitrogen atom of a primary amino group (labeled with "—NH$_2$") and a peak attributed to a nitrogen atom of a secondary amino group (labeled with "—NH") which are overlapped with each other. The intensity of the second peak is about 2.5 times the intensity of the first peak. As compared with the XPS spectrum of ImS shown in FIG. 2, since the intensity of the second peak to that of the first peak remarkably increases, it can be seen that a compound having an amino group (AAS in this example) is contained, in addition to ImS.

XPS analysis of the film of the compound containing the first compound, ImS, revealed that the peak (about 400.8 to about 401.0 eV) attributed to a nitrogen atom bonded by the double bond (—C=N—C—) is confirmed. Since this peak is separated from the peak attributed to a nitrogen atom of an amino group contained in the second compound (about 398.5 to about 400.0 eV), it can be confirmed that the first compound and the second compound are contained.

A method for producing a copper alloy article 3 according to the present embodiment will be described below with reference to FIGS. 5(a) and 5(b).

<1-1. Formation of Compound Layer 20>

A solution containing a first compound having a nitrogen-containing functional group and a silanol group and a second compound which is an alkane type amine-based silane coupling agent is brought into contact with a surface of a polyester-based resin body 40. The solution can be brought into contact with the surface of the polyester-based resin body 40 by a known method such as a coating or spraying method. Thereafter, a heat treatment is performed, thus making it possible to form a compound layer 20 on the surface of the polyester-based resin body 40 (FIG. 5(a)). Thereby, a polyester-based resin member 47 including the polyester-based resin body 40 and the compound layer 20 is obtained.

A first solution containing the first compound and a second solution containing the second compound may be separately prepared instead of the solution containing the first compound and the second compound. By sequentially bringing the first solution and the second solution into contact with the surface of the polyester-based resin body 40, the first compound and the second compound can be mixed and adsorbed on the surface of the polyester-based resin body 40. The second solution may be contacted after contacting the first solution, or the second solution may be contacted after contacting the first solution.

In a compound having a nitrogen-containing functional group and a silanol group, it is preferable that the nitrogen-containing functional group has a nitrogen-containing 5-membered ring or higher-membered cyclic structure. It is particular preferable that the 5-membered ring or higher-membered cyclic structure is a triazole or triazine structure. Examples of specific compounds include AST analogous compounds in which a part of functional groups of AST, ImS and AST mentioned in Table 5 are substituted with other functional groups, imidazole silane coupling agents and the like. Examples of the AST analogous compound include compounds in which a triethoxy group of AST is substituted with a trimethoxy group, and compounds in which an amino substituent of a 4,6-di(2-aminoethyl)amino group of AST is substituted with an N-2-(aminoethyl)-3-aminopropyl group, a 3-aminopropyl group, an N-(1,3-dimethyl-methylidyne) propylamino group, an N-phenyl-3-aminopropyl group, an N-(vinylbenzyl)-2-aminoethyl-3-aminopropyl group or a 3-ureidopropyl group. Examples of the imidazole silane coupling agent include tris-(trimethoxysilylpropyl)isocyanurate, and those having any one of a 1-imidazolyl group, a 3-imidazolyl group and a 4-imidazolyl group, together with a trialkoxysilyl group such as a trimethoxy group or a triethoxy group.

The alkane type amine-based silane coupling agent is preferably a linear alkane type amine-based silane coupling agent. Specific examples of the compound include N-2-(aminoethyl)-3-aminopropylmethyldimethoxysilane, N-2-(aminoethyl)-3-aminopropyltrimethoxysilane, 3-aminopropyltrimethoxysilane, 3-aminopropyltriethoxysilane and the like.

<1-2. Cleaning of Copper Alloy Substrate 10>

The surface of the copper alloy substrate 10 is cleaned with an aqueous acid solution. Thereby, the oxide layer and the rust preventive present on the surface of the copper alloy substrate 10 can be removed.

It is possible to employ, as the aqueous acid solution, for example, an aqueous solution of an acid solution, such as sulfuric acid, hydrochloric acid, a mixed solution of sulfuric acid and chromic acid, a mixed solution of sulfuric acid and hydrochloric acid, or a mixed solution of sulfuric acid and nitric acid. Particularly, an aqueous sulfuric acid solution or an aqueous hydrochloric acid solution is preferable.

Cleaning can be performed by immersing the copper alloy substrate 10 in the aqueous acid solution for a predetermined time. The immersing time may be in any range as long as the oxide layer on the surface and the rust preventive can be removed and the copper alloy substrate 10 is not significantly eroded. For example, when 1% hydrochloric acid is used, the copper alloy substrate can be immersed for 30 seconds to 10 minutes (e.g., 1 minute). When 15% sulfuric acid is used, the copper alloy substrate may be immersed for 1 to 20 minutes (e.g., 5 minutes).

<1-3. Bonding of Copper Alloy Substrate 10 and Polyester-Based Resin Member 47>

Figure 5A:
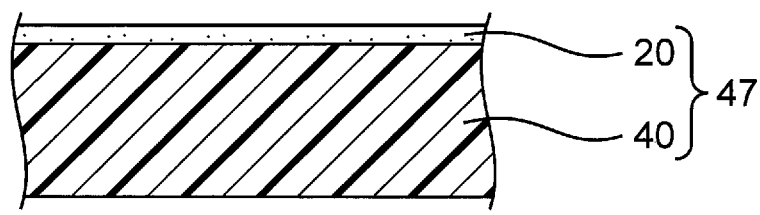
FIG. 5(a) and FIG. 5(b) are schematic cross-sectional views for explaining a first method for producing a copper alloy article according to Embodiment 1.
Figure 5B:
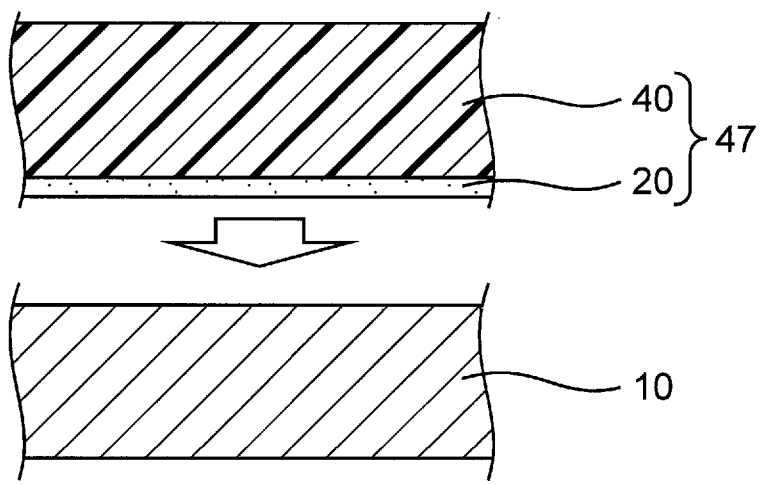

As shown in FIG. 5(b), by pressing a compound layer 20 of a polyester-based resin member 47 and a cleaned copper alloy substrate 10 while they are brought into contact with each other, the polyester-based resin member 47 and the copper alloy substrate 10 are bonded to each other, thus making it possible to obtain a copper alloy article 3 as shown in FIG. 1. This can also be regarded as bonding the polyester-based resin body 40 of the polyester-based resin member 47 and the copper alloy substrate 10 to each other through the compound layer 20 interposed therebetween.

It is preferable to heat the copper alloy substrate 10 and the polyester-based resin member 47 before or during pressurization since heating facilitates bonding. The heating temperature is set at the temperature at which the polyester-based resin body 40 of the polyester-based resin member 47 is not melted. Pressurization can be performed by setting at a surface pressure of 1 MPa to 8 MPa, e.g., 4 MPa.

As a modification of the production method, the compound layer 20 may be formed on the surface of the copper alloy substrate 10. Modifications will be described with reference to FIGS. 6(a) and 6(b).

<2-1. Formation of Compound Layer 20>

A solution containing a compound having a nitrogen-containing functional group and a silanol group is brought into contact with the surface of the cleaned copper alloy substrate 10. Thereafter, a heat treatment is performed, thus making it possible to form a compound layer 20 on the surface of the copper alloy substrate 10 (FIG. 6(a)). Thereby, a copper alloy member 15 including the copper alloy substrate 10 and the compound layer 20 is obtained.

Details of the compound layer 20 are as the same as in the step 1-1.

<2-2. Cleaning of Copper Alloy Substrate 10>

According to the same step as the step 1-2 of Embodiment 1, the surface of the copper alloy substrate 10 is cleaned with an aqueous acid solution to remove the oxide layer and the rust preventive present on the surface of the copper alloy substrate 10.

<2-3. Bonding of Copper Alloy Member 15 and Polyester-Based Resin Body 40>

Figure 6A:
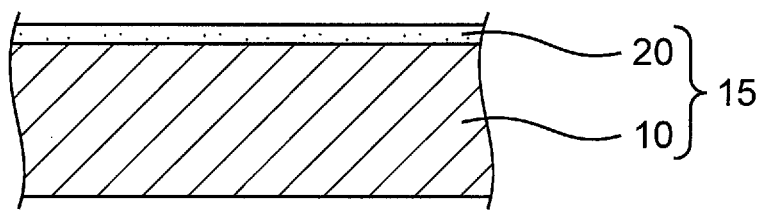
FIG. 6(a) and FIG. 6(b) are schematic cross-sectional views for explaining a second method for producing a copper alloy article according to Embodiment 1.
Figure 6B:
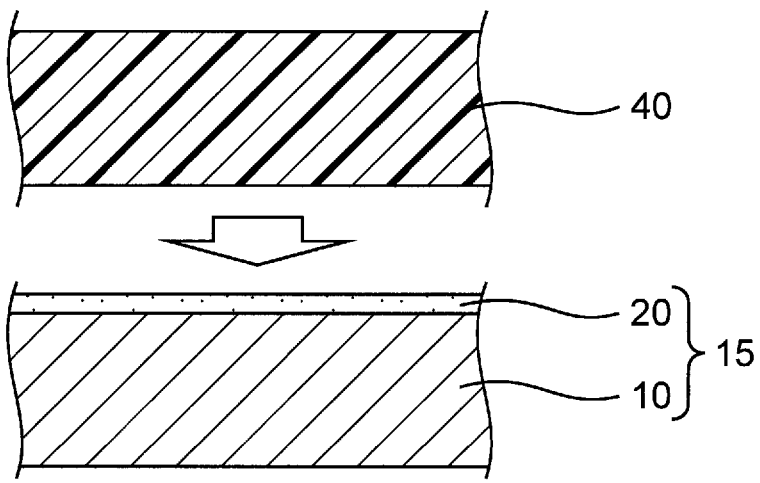

As shown in FIG. 6(b), by pressing a polyester-based resin body 40 and a compound layer 20 of a copper alloy member 15 while they are brought into contact with each other, the polyester-based resin member 40 and the copper alloy substrate 15 are bonded to each other, thus making it possible to obtain a copper alloy article 3 as shown in FIG. 1.

The details of pressure bonding are the same as in Embodiment 1.

By preparing the polyester-based resin member 47 including the compound layer 20 (FIG. 5(a)) and the copper alloy member 15 including the compound layer 20 (FIG. 6(a)) and pressing these compound layers 20 while they are brought into contact with each other, a copper alloy article 3 as shown in FIG. 1 can also be obtained.

The compound layer of the polyester-based resin member 47 may be formed of a first solution containing a first compound having a nitrogen-containing functional group and a silanol group, and a compound layer of the copper alloy member 15 may be formed of a second solution containing a second compound which is an alkane type amine-based silane coupling agent. When the compound layer of the polyester-based resin member 47 and the compound layer of the copper alloy member 15 are brought into contact with each other during bonding, in case the first compound contained in one compound layer and the second compound contained in the other compound layer are chemically adsorbed together, the compound layer 20 containing the first compound and the second compound can be formed.

When the first compound contained in one compound layer and the second compound contained in the other compound layer are not sufficiently chemically adsorbed, the effect of improving the bonding strength may not be sufficiently exhibited. Therefore, it is preferable to appropriately select the method for formation of a compound layer depending on the compound to be used.

The invention according to the present disclosure will be described by way of Examples.

Properties of Each Compound

A 50 μm-thick LCP film CT-Z (manufactured by Kuraray Co., Ltd.) was cut into square with each side of 150 mm to prepare four test pieces (LCP film pieces). Each of four types of aqueous compound solutions (aqueous ET solution, aqueous AAS solution, aqueous ImS solution, and aqueous AST solution) was applied on both surfaces of the test piece of the LCP film using a dip coater manufactured by JSP Co., Ltd. The concentration of each aqueous solution was adjusted to 0.1%.

A copper foil B (manufactured by UACJ Foil Corporation, thickness: 18 μm) was cleaned with 1% hydrochloric acid for 1 minute, sufficiently washed with ion exchanged water, and then dried. The copper foil B was cut into square with each side of 150 mm to prepare eight test pieces (copper foil pieces). Each of four types of the above aqueous compound solutions was applied on both surfaces of the test piece of the copper foil using a dip coater manufactured by JSP Co., Ltd. One type of an aqueous compound solution was applied to two copper foil pieces.

Thereafter, the LCP film piece and the copper foil piece coated with the aqueous solution were heat-treated at 100° C. for 5 minutes. Thereby, a compound layer was formed on both surfaces of the LCP film piece and both surfaces of the copper foil piece.

The copper foil piece was placed on both surfaces of the LCP film piece on which the compound layer was formed, and then the temperature was raised to 270° C. while pressurizing under a surface pressure of 4 MPa using a vacuum press machine manufactured by Kitagawa Seiki Co., Ltd., followed by holding for 20 minutes and further heating at 290° C. for 10 minutes to prepare a double-sided copper clad laminate. In this double-sided copper clad laminate, a compound layer is placed between the LCP film and the copper foil.

In this test, the aqueous compound solution was applied to both the LCP film and the copper foil. Even if the aqueous compound solution was applied to any one of them, a compound layer can be formed between the LCP film and the copper foil. That is, the surface to be coated can be appropriately determined depending on the wettability of the compound solution, the ease of formation of the compound layer, the required amount of the compound and the like.

As a comparative control, a double-sided copper clad laminate was prepared in the same manner using a test piece in which an aqueous compound solution is not applied to both the LCP film and the copper foil.

A test piece was cut out from the double-sided copper clad laminate in a strip shape and the entire surface of the copper foil on the back surface was removed by etching in accordance with JIS C 6471 8.1 "Peeling Strength of Copper Foil", and then a pattern with a width of 10 mm was left by etching to prepare a peeling test piece. The LCP film side of the back surface of the peeling test piece was fixed to a reinforcing plate using a double-sided tape and the copper foil was peeled in the 180° direction at a peeling rate of 50 mm/min using Autograph AGS-5kNX manufactured by Shimadzu Corporation, followed by the measurement of the peeling strength under each condition using three test pieces. From the peeling test chart, the minimum value and the maximum value were read. The results are shown in Table 6.

TABLE 6

| Compound | Peeling strength (kN/m) (minimum value/ maximum value) | Peeling state |
| --- | --- | --- |
| None | 0.16/0.20 | Interfacial peeling |
| ET | 0.08/0.11 | Interfacial peeling |
| AAS | 0.32/0.37 | Scaly cohesive peeling |
| ImS | 0.39/0.44 | Cohesive peeling |
| AST | 0.59/0.68 | Cohesive peeling |

When the compound layer is not provided, the LCP film and the copper foil were not bonded to each other and peeling occurred at the interface between the copper foil and the LCP film. The minimum value and maximum value of the peeling strength were 0.16 kN/m and 0.20 kN/m, respectively.

In case the LCP film and the copper foil were bonded to each other through the compound layer containing the compound ET, peeling occurred at the interface between the copper foil and the LCP film when a peeling test was performed. The minimum value and the maximum value of the peeling strength were 0.08 kN/m and 0.11 kN/m, respectively. That is, it can be said that the copper foil and the LCP film cannot be bonded to each other using the compound layer containing the compound ET. As shown by the above XPS analysis, it is considered that the compound ET is not chemically adsorbed to both the copper foil and the LCP film, thus failing to bond them. The results revealed that, even when having a 6-membered triazine ring structure, the LCP film and the copper foil cannot be bonded to each other with sufficient strength in case all substituents of the nitrogen atom (N) are epoxy groups, that is, there is no alkoxysilane group.

When the LCP film and the copper foil were bonded to each other through the compound layer containing the compound AAS, the thin white LCP film remained (scaly cohesive peeling) as a result of observation of the peeling interface of the copper foil after the peeling test. The minimum value and the maximum value of the peeling strength were 0.32 kN/m and 0.37 kN/m, respectively. As shown by the above XPS analysis, it is considered that the compound AAS has low chemical adsorptivity to both the copper foil and the LCP film, leading to comparatively low peeling strength.

When the LCP film and the copper foil were bonded to each other through the compound layer containing the compound ImS, the white LCP film remained (cohesive peeling) as a result of observation of the peeling interface of the copper foil after the peeling test. The minimum value and the maximum value of the peeling strength were 0.39 kN/m and 0.44 kN/m, respectively.

When the LCP film and the copper foil were bonded through the compound layer containing the compound AST, the white LCP film remained (cohesive peeling) as a result of observation of the peeling interface of the copper foil after the peeling test. The minimum value and the maximum value of the peeling strength were 0.59 kN/m and 0.68 kN/m, respectively.

The results revealed that a nitrogen-containing cyclic molecular structure (compounds ImS and AST) is effective for bonding the copper metal substrate as compared with an amino group on the linear saturated carbon of the alkane type amine-based silane coupling agent (compound AAS).

Example 1

Examination was made of the effect of compositely adding a compound having a nitrogen atom-containing cyclic molecular structure (first compound) and an alkane type amine-based silane coupling agent (second compound).

A 50 μm-thick LCP film CT-Z (manufactured by Kuraray Co., Ltd.) was cut into square with each side of 150 mm to prepare four test pieces (LCP film pieces). Four LCP film pieces were prepared. Any one of aqueous compound solutions containing the compound in Table 7 was coated on both surfaces of the LCP film piece using a dip coater manufactured by JSP Co., Ltd. Specifically, in Example 1, a compound layer was formed using an aqueous mixed solution containing 0.1% by weight of ImS and 1% by weight of AAS. In Comparative Example 2, an aqueous solution containing 0.1% by weight of ImS was used. In Comparative Example 1, an aqueous solution containing 0.1% by weight of AAS was used.

"Copper foil B" (manufactured by UACJ Foil Corporation, thickness: 18 μm) shown in Table 1 was cleaned with 1% hydrochloric acid for 1 minute, sufficiently washed with ion exchanged water, and then dried. The copper foil B was cut into square with each side of 150 mm to prepare test pieces (copper foil pieces). Eight copper foil pieces were prepared. Each of four types of the above aqueous compound solutions was applied on both surfaces of the copper foil piece using a dip coater manufactured by JSP Co., Ltd. One type of an aqueous compound solution was applied to two copper foil pieces.

Thereafter, the LCP film piece and the copper foil piece coated with the aqueous solution were heat-treated at 100° C. for 5 minutes. Thereby, a compound layer was formed on both surfaces of the LCP film piece and both surfaces of the copper foil piece.

The copper foil piece was placed on both surfaces of the LCP film piece on which the compound layer was formed, and then the temperature was raised to 270° C. while pressurizing under a surface pressure of 4 MPa using a vacuum press machine manufactured by Kitagawa Seiki Co., Ltd., followed by holding at 270° C. for 20 minutes and further holding at 290° C. for 10 minutes to prepare a double-sided copper clad laminate. In this double-sided copper clad laminate, a compound layer is placed between the LCP film and the copper foil.

The results of the peeling test are shown in Table 7.

TABLE 7

| | Compound | Peeling strength (kN/m) (minimum value/ maximum value) | Peeling state |
|---|---|---|---|
| Example 1 | ImS + AAS | 0.44/0.68 | Cohesive peeling |
| Comparative Example 1 | ImS | 0.39/0.44 | Cohesive peeling |
| Comparative Example 2 | AAS | 0.32/0.37 | Scaly cohesive peeling |

Like Comparative Example 1, when the LCP film and the copper foil are bonded to each other through a compound layer containing only the compound ImS (first compound), the minimum value and the maximum value of the peeling strength were 0.39 kN/m and 0.44 kN/m, respectively.

Like Comparative Example 2, when the LCP film and the copper foil were bonded through a compound layer containing only the compound AAS (second compound), the minimum value and the maximum value of the peeling strength were 0.32 kN/m and 0.37 kN/m, respectively.

Meanwhile, like Example 1, when the LCP film and the copper foil are bonded through a compound layer containing both the compound ImS (first compound) and the compound AAS (second compound), the minimum value and the maximum value of the peeling strength were 0.44 kN/m and 0.68 kN/m, respectively.

When compared with the maximum value of the peeling strength, the peeling strength of Example 1 was about 1.55 times (0.68/0.44) the peeling strength of Comparative Example 1 and about 1.84 times (0.68/0.37) the peeling strength of Comparative Example 2. That is, it has been found that it is possible to realize an improvement in peeling strength by 1.5 times or more as compared with the case of using each compound alone only by mixing the compound ImS with the compound AAS, like Example 1. By comparing the maximum value, it is possible to know how much the maximum value of the bonding strength, which can be realized by the compound layer as in Example 1, can be improved.

Example 2

In Example 2, a test piece ("double-sided copper clad laminate" in which an LCP film piece and a copper foil piece are laminated) was formed in the same manner as in Example 1 using an aqueous compound solution containing the compound in Table 8, and a peeling test was performed. Specifically, in Example 2, a compound layer was formed using an aqueous mixed solution containing 0.1% by weight of AST and 1% by weight of AAS. In Comparative Example 3, an aqueous solution containing 0.1% by weight of AST was used.

The results of the peeling test are shown in Table 8.

TABLE 8

| | Compound | Peeling strength (kN/m) (minimum value/ maximum value) | Peeling state |
|---|---|---|---|
| Example 2 | AST + AAS | 0.68/0.77 | Cohesive peeling |
| Comparative Example 2 | AAS | 0.32/0.37 | Scaly cohesive peeling |
| Comparative Example 3 | AST | 0.59/0.68 | Cohesive peeling |

As mentioned above, in Comparative Example 2, when the LCP film and the copper foil are bonded to each other through the compound layer containing only the compound AAS (second compound), the minimum value and the maximum value of the peeling strength were 0.32 kN/m and 0.37 kN/m, respectively.

Like Comparative Example 3, when the LCP film and the copper foil are bonded to each other through a compound layer containing only the compound AST (first compound), the minimum value and the maximum value of the peeling strength were 0.59 kN/m 0.68 kN/m, respectively.

Meanwhile, like Comparative Example 2, when the LCP film and the copper foil are bonded to each other through a compound layer containing both the compound AST (first compound) and the compound AAS (second compound), the minimum value and the maximum value of the peeling strength were 0.68 kN/m and 0.77 kN/m, respectively.

When compared with the maximum value of the peel strength, the peeling strength of Example 2 was about 2.08 times (0.77/0.37) the peeling strength of Comparative Example 2 and about 1.13 times (0.77/0.68) the peeling strength of Comparative Example 3. That is, it has been found that it is possible to realize an improvement in peeling strength of 1.13 times or more as compared with the case of using each compound alone only by mixing the compound AST with the compound AAS, like Example 2. Although the bonding strength achieved by using AST alone is sufficiently high among conventional silane coupling agents, it is possible to further improve the bonding strength according to the embodiments of the present invention.

Based on the experimental results of Examples 1 and 2, the mechanism of microchemical adsorption is estimated. Since the first compound (e.g., compounds ImS and AST) having a nitrogen atom-containing cyclic molecular structure has a large molecular structure, space is formed between the molecules when chemically adsorbed. A second compound having a small molecular weight and having a chain structure (e.g., compound AAS) can have the effect of entering into the intermolecular space between the first compounds ImS and AST and blocking the space. This makes it possible to enhance the chemical adsorption density when totaling the first compound and the second compound, thus enabling an improvement in bonding strength between the LCP film and the copper foil.

Examples 3 to 7

In Examples 3 to 7, (A) a peeling test, (B) XPS analysis and (C) an FT-IR test were performed.
(A) Peeling Test A relationship between the mixing ratio of the compounds AST and AAS and the bonding strength used in Example 2 was examined.

In the aqueous mixed solution containing the first compound (compound AST) and the second compound (AAS), the total molar concentration of AST and AAS was fixed at 48 mmol/L and each concentration of AST and AAS was changed in terms of a molar ratio in a range of 1:0 to 1:15 (2:0 to about 0.1:1.0 in terms of a ratio of % by weight). The molar concentration was fixed to a given value since it is possible to properly compare properties of the compounds by comparing with the number of molecules in the solution. That is, by defining the molar concentration, it is possible to properly compare a relationship between the chemical adsorptivity of each molecule and the bonding strength.

The test piece (double-sided copper clad laminate) used in the peeling test was formed in the same manner as in Example 1.

Details of compositely addition and measurement results of the peeling strength are shown in Table 9.

It is particularly preferable that a molar ratio of the first compound (AST) to the second compound (AAS) is 1:1 to 1:10 (Examples 4 to 6), and the maximum value of the tensile strength becomes 0.70 kN/m or more, which could not be achieved by a conventional compound, thus making it possible to achieve extremely strong bonding strength.

(B) XPS Analysis

A relationship between the mixing ratio of the first compound (AST) to the second compound (AAS) and the state of chemical adsorption of the compound on the copper foil surface was examined.

An aqueous mixed solution containing the first compound (compound AST) and the second compound (AAS) was applied on a surface of the copper foil piece. The aqueous mixed solution to be used are the same as those used in Examples 3 to 6 and Comparative Examples 4 and 5 (see Table 9).

TABLE 9

|  |  | Comparative Example 4 | Example 3 | Example 4 | Example 5 | Example 6 | Example 7 | Comparative Example 5 |
|---|---|---|---|---|---|---|---|---|
| AST:AAS | mmol/L | 1:0 | 1:0.5 | 1:1 | 1:2 | 1:10 | 1:15 | 0:1 |
| AST | % by weight | 2 | 1.33 | 1.00 | 0.67 | 0.18 | 0.13 | — |
|  | mmol/L | 48 | 32 | 24 | 16 | 4.4 | 3 | — |
| AAS | % by weight | — | 0.36 | 0.53 | 0.71 | 0.97 | 1.01 | 1.07 |
|  | mmol/L | — | 16 | 24 | 32 | 43.6 | 45 | 48 |
| Total | % by weight | 2 | 1.69 | 1.53 | 1.38 | 1.15 | 1.14 | 1.07 |
|  | mmol/L | 48 | 48 | 48 | 48 | 48 | 48 | 48 |
| Peeling strength (minimum value/maximum value) | kN/m | 0.60/0.65 | 0.63/0.67 | 0.69/0.71 | 0.68/0.74 | 0.70/0.73 | 0.55/0.61 | 0.42/0.47 |

Like Comparative Example 4, when a test piece was formed using an aqueous solution containing only the compound AST, the minimum value and the maximum value of the peeling strength were 0.60 kN/m and 0.65 kN/m, respectively. When a test piece is formed using an aqueous mixed solution of the compound AST and the compound AAS by substituting a part of the compound AST with AAS, the peel strength tends to be improved. For example, in Examples 3 to 6, the minimum value of the peel strength is 0.63 to 0.70 kN/m and the maximum value is 0.67 to 0.73 kN/m. In Example 6 in which the peeling strength is the highest, the maximum value of the peeling strength was about 1.12 times (0.73/0.65) that of Comparative Example 4.

The minimum value and the maximum value of the peeling strength of Example 7 were 0.55 kN/m and 0.61 kN/m, respectively, which were lower than those of Comparative Example 4, but were higher than those of Comparative Example 5 (using an aqueous solution containing only AAS) (the minimum value is 0.42 kN/m and the maximum value is 0.47 kN/m).

It has been found that the peeling strength can be improved as compared with the case of containing only the second compound (AAS) (Comparative Example 5) by adding both the first compound (AST) and the second compound (AAS) to the aqueous compound solution (Examples 3 to 7).

It has been found that the peeling strength can be improved as compared with the case of containing only the first compound (AST) (Comparative Example 4) by particularly adding the first compound (AST) and the second compound (AAS) at a predetermined ratio (AST:AAS=1:0.5 to 1:10) (Examples 3 to 6).

Any one of aqueous solutions is applied to the surface (both surfaces) of the copper foil piece using a dip coater manufactured by JSP Co., Ltd. Thereafter, the copper foil piece was heat-treated at 100° C. for 5 minutes to form a compound layer on the surface of the copper foil piece, and the surface of the copper foil piece coated with the compound layer was subjected to XPS analysis. XPS spectra of each copper foil piece are shown in FIGS. 7 to 12.

In order to investigate chemical adsorption of the compound on the copper foil surface, the XPS spectrum was analyzed mainly with respect to the Cu 2p orbital peak of the XPS spectrum. Regarding the Cu 2p orbital peak, a Cu—N bond peak, a Cu—O bond peak and a Cu (0-valent) peak are mainly observed. In FIGS. 7 to 12, the Cu—N bond peak is labeled as "Cu—N", the Cu—O bond peak is labeled as "Cu—O", and the Cu (0-valent) peak is labeled as "Cu(0)".

Each peak is interpreted as follows.

(i) The Cu—N bond peak indicates that the triazine ring and the amino group (both are derived from AST) in the compound layer are chemically adsorbed on the copper foil surface.

(ii) The Cu—O bond peak indicates that the silanol group (derived from AST) in the compound layer is chemically adsorbed on the copper foil surface.

(iii) The Cu (0-valent) peak indicates that the copper foil surface, on which the compound is not chemically adsorbed, is present.

Figure 7:
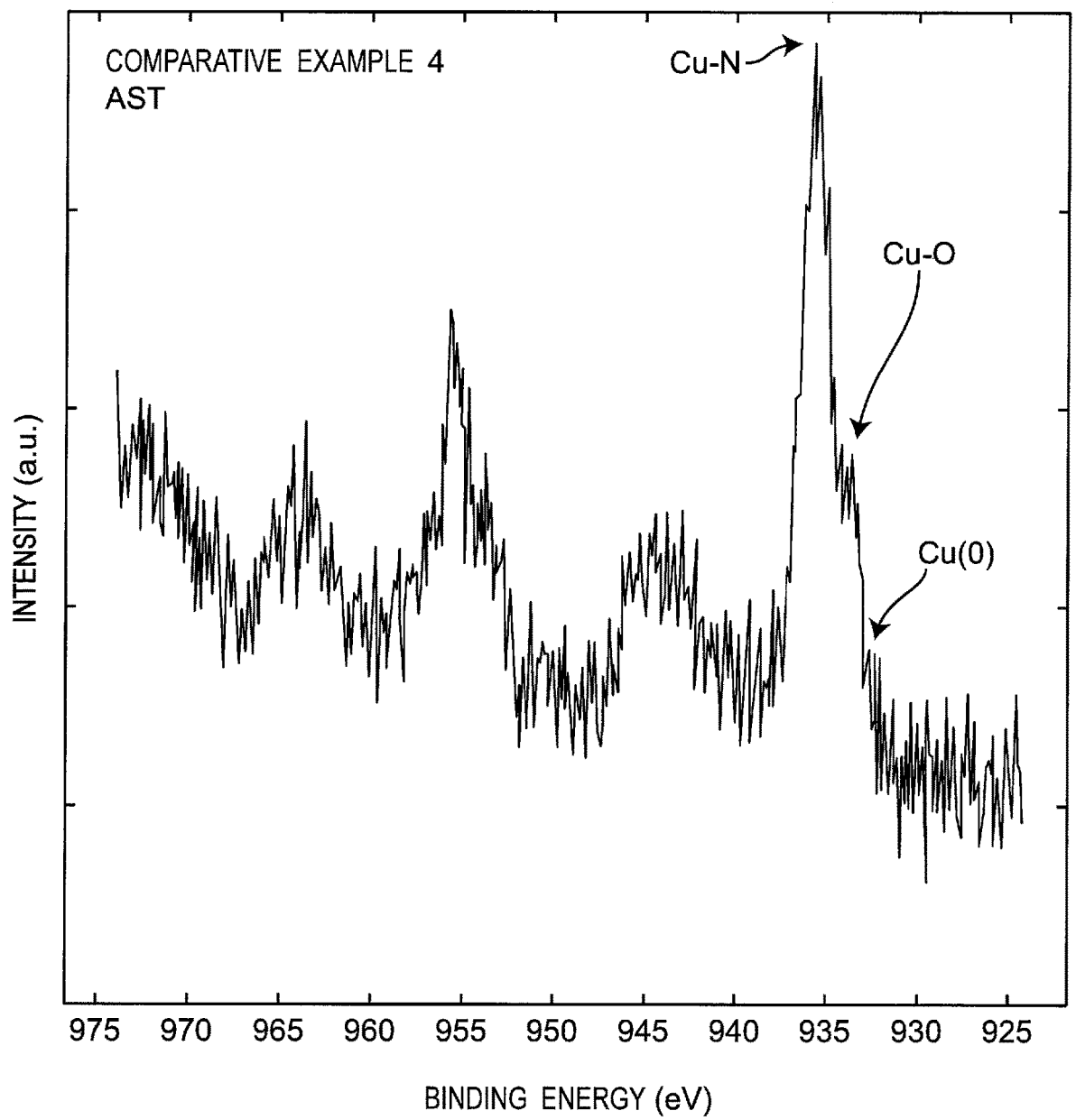
FIG. 7 is an XPS spectrum of a copper foil piece surface coated with AST.

FIG. 7 is an XPS spectrum of a copper foil piece having a compound layer formed by the aqueous AST solution (see Table 9) used in Comparative Example 4. As a result of detailed analysis of the Cu 2p orbital peak, a slightly small Cu—O bond peak was observed, in addition to the main Cu—N bond peak (Table 5). The Cu (0-valent) peak was not observed since it was hidden by noise.

The silanol group indicated by the Cu—O bond peak is a functional group contributing to chemical adsorption with the ester structure contained in LCP, PET and the like. Therefore, in order to improve the peeling strength between the copper foil and the resin film having an ester structure, the silanol group chemically adsorbed on the copper foil surface (i.e., silanol group to be consumed) preferably exists in a small proportion. That is, in the XPS spectrum, it is preferable that no Cu—O bond peak is observed (or the peak is as small as possible).

Figure 8:
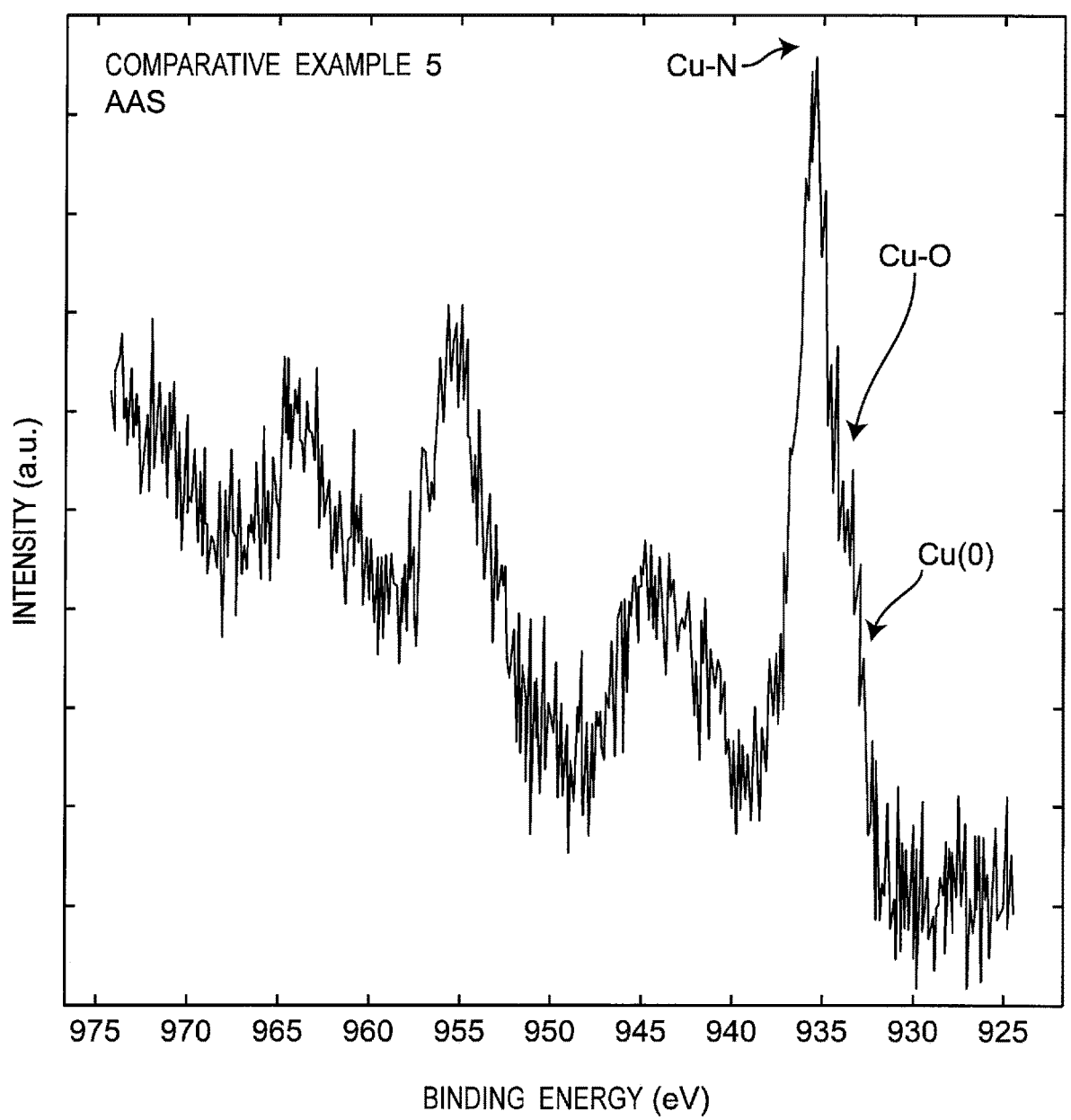
FIG. 8 is an XPS spectrum of a copper foil piece surface coated with AAS.

FIG. 8 is an XPS spectrum of a copper foil piece having a compound layer formed by the aqueous AAS solution (see Table 9) used in Comparative Example 5. As a result of detailed analysis of the Cu 2p orbital peak of the XPS spectrum of FIG. 8, like the XPS spectrum (coated with AST) of FIG. 7, a Cu (0-valent) peak was observed, in addition to the Cu—N bond peak and a slightly small Cu—O bond peak.

Figure 9:
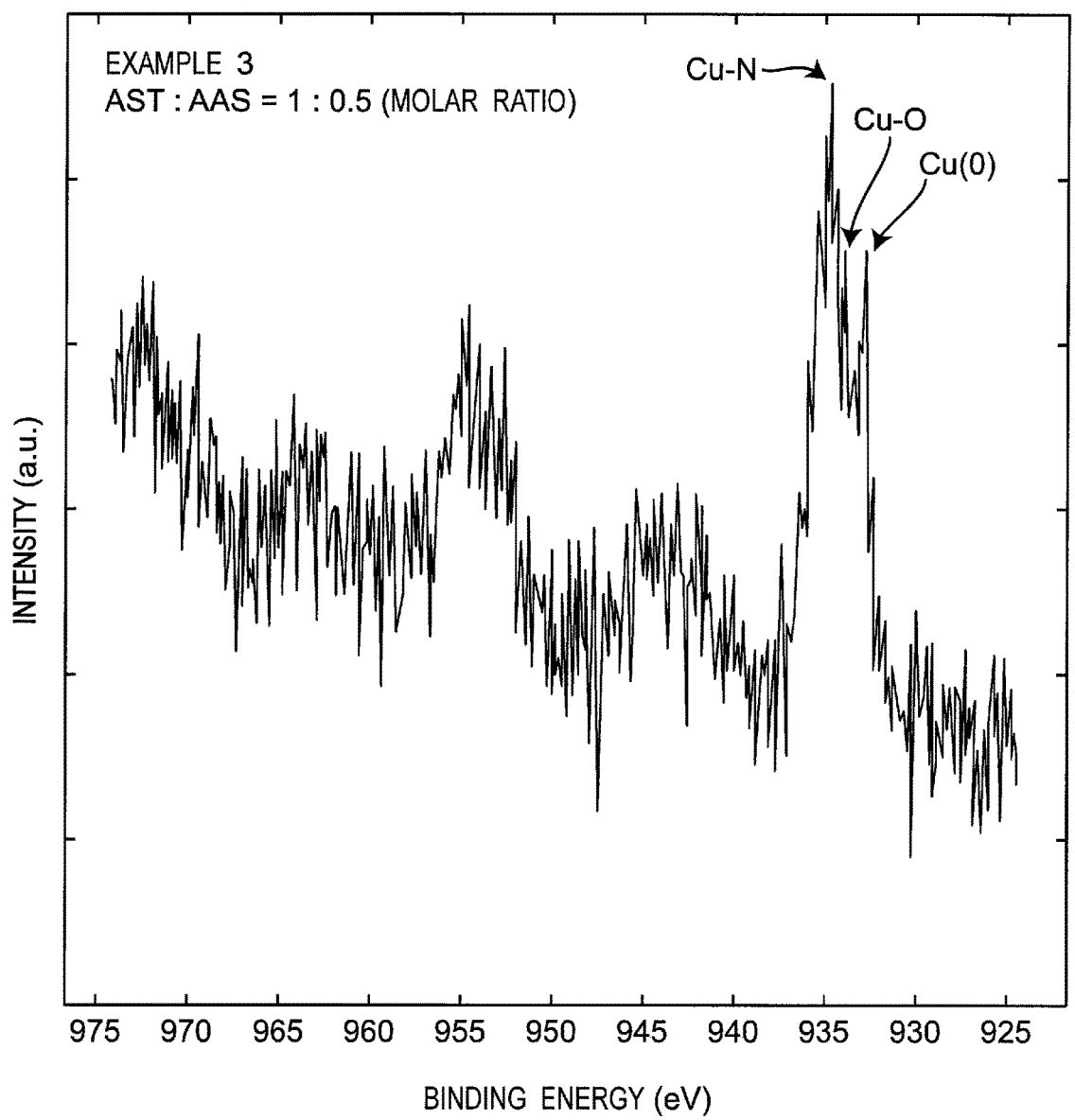
FIG. 9 is an XPS spectrum of a copper foil piece surface coated with an aqueous mixed solution of AST and AAS.
Figure 10:
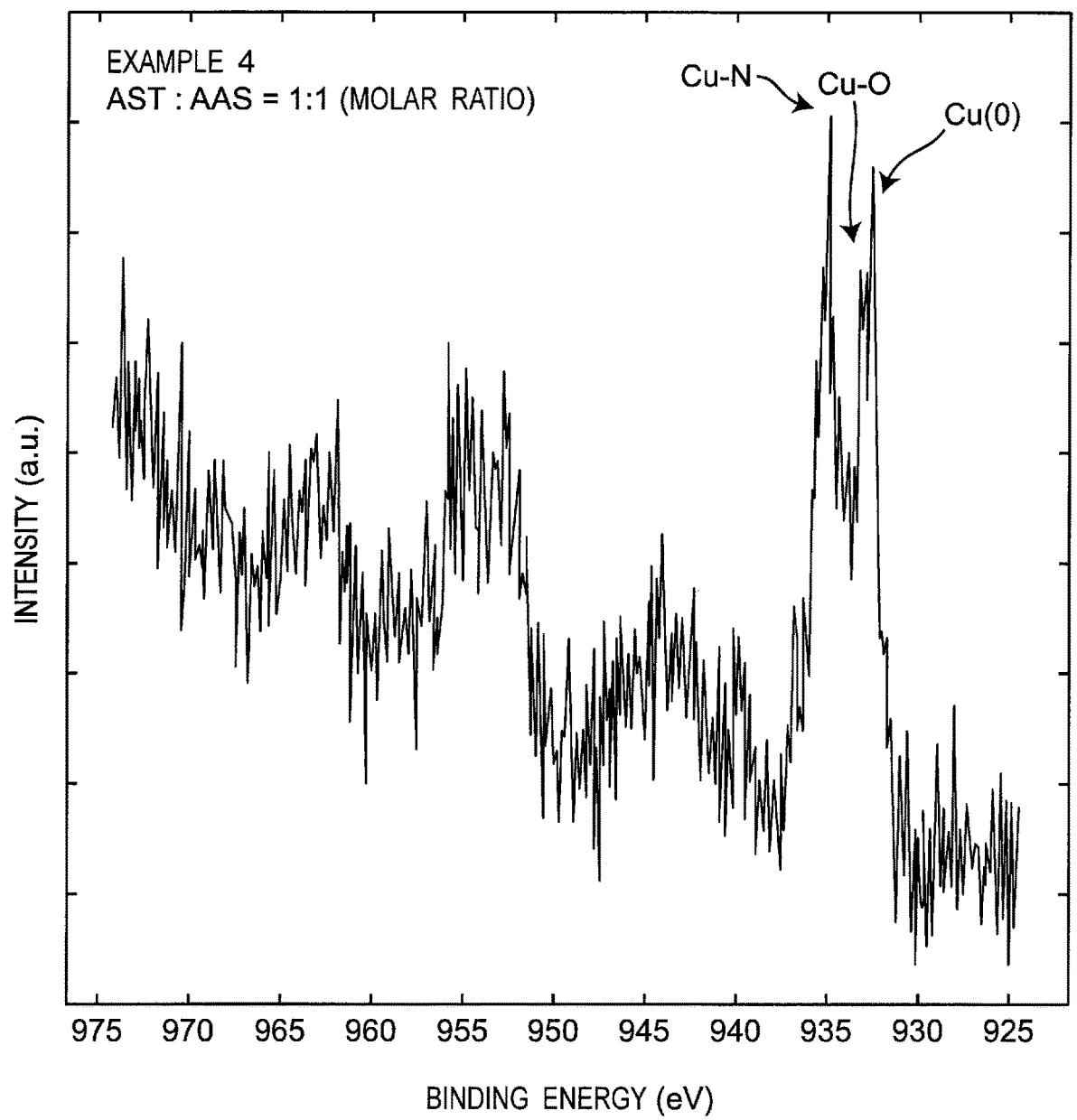
FIG. 10 is an XPS spectrum of a copper foil piece surface coated with an aqueous mixed solution of AST and AAS.
Figure 11:
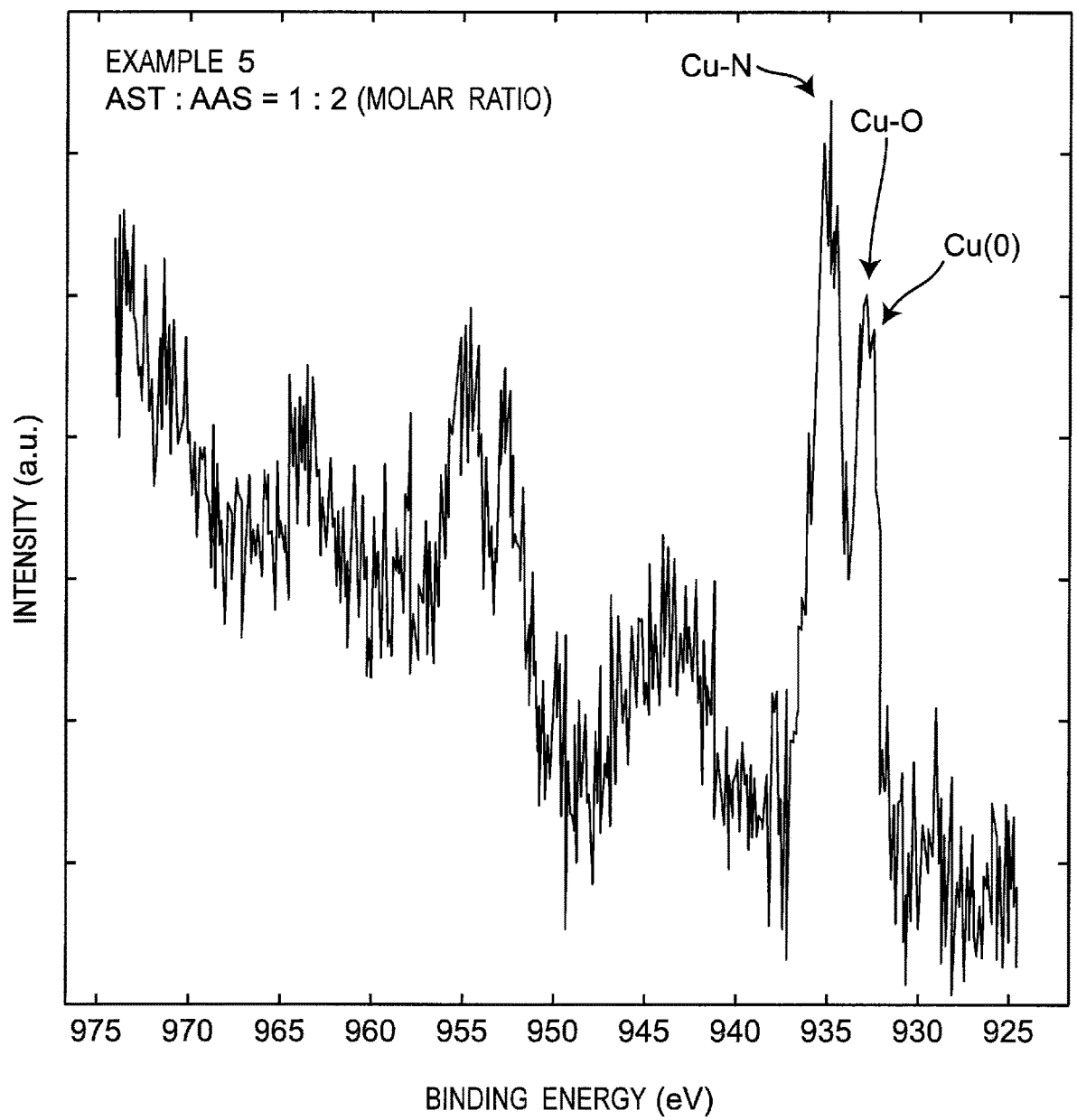
FIG. 11 is an XPS spectrum of a copper foil piece surface coated with an aqueous mixed solution of AST and AAS.

FIGS. 9 to 11 are XPS spectra of a copper foil piece having a compound layer formed by the aqueous mixed solution of AST and AAS (see Table 9) used in Examples 3 to 5.

In FIG. 9, a molar ratio of AST to AAS in the aqueous mixed solution used is 1:0.5. In FIG. 10, a molar ratio is 1:1. In FIG. 11, a molar ratio is 1:2. In the XPS spectrum of FIGS. 9 to 11, a main Cu—N bond peak, a Cu—O bond peak and a Cu (0-valent) peak were observed. In XPS spectra thereof, each peak intensity of the Cu—O bond peak and the Cu (0-valent) peak is larger than that in FIGS. 7 and 8, and becomes closer to the peak intensity of the Cu—N bond peak. That is, by mixing AAS with AST, it becomes possible to observe the Cu (0-valent) peak, which was not observed in FIG. 7 (AST alone), and the peak intensity of the Cu—O bond peak increased to the same level as that of the Cu—N bond peak.

These results revealed the following tendency when the molar ratio of AST to AAS in the aqueous mixed solution is 1:0.5 to 1:2.

Since the peak intensity of the Cu (0-valent) peak increases, the density of chemical adsorption of the compound on the surface of the copper foil decreases.

Since the peak intensity of the Cu—O bond peak increases, it is considered that a large amount of silanol groups are chemically adsorbed on the surface of the copper foil, where a large amount of silanol groups are consumed. As mentioned above, since the silanol group is chemically adsorbed to the ester structure of the resin film, it is not preferable that the silanol group is consumed on the surface of the copper foil.

These results can be regarded as a state where the effect of adding AAS to AST is not sufficiently exerted from the viewpoint of chemical adsorption of the compound on the copper foil surface.

As a result of analyzing the Cu 2p spectrum in more detail, the peak intensity of the Cu—O bond peak and that of the Cu (0-valent) peak are almost the same in FIG. 9 (a molar ratio of AST and AAS is 1:0.5). In FIG. 10 (a molar ratio is 1:1), the peak intensity of the Cu (0-valent) peak is larger than that of the Cu—O bond peak. In FIG. 11 (a molar ratio is 1:2), the peak height of the Cu (0-valent) peak became slightly lower than that of the Cu—O bond peak. It has been found that a change in molar ratio of AST and AAS in the aqueous mixed solution leads to a change in peak intensity of the Cu (0-valent) peak and the Cu—O bond peak, thus changing the state of chemical adsorption of the compound on the copper foil surface.

Figure 12:
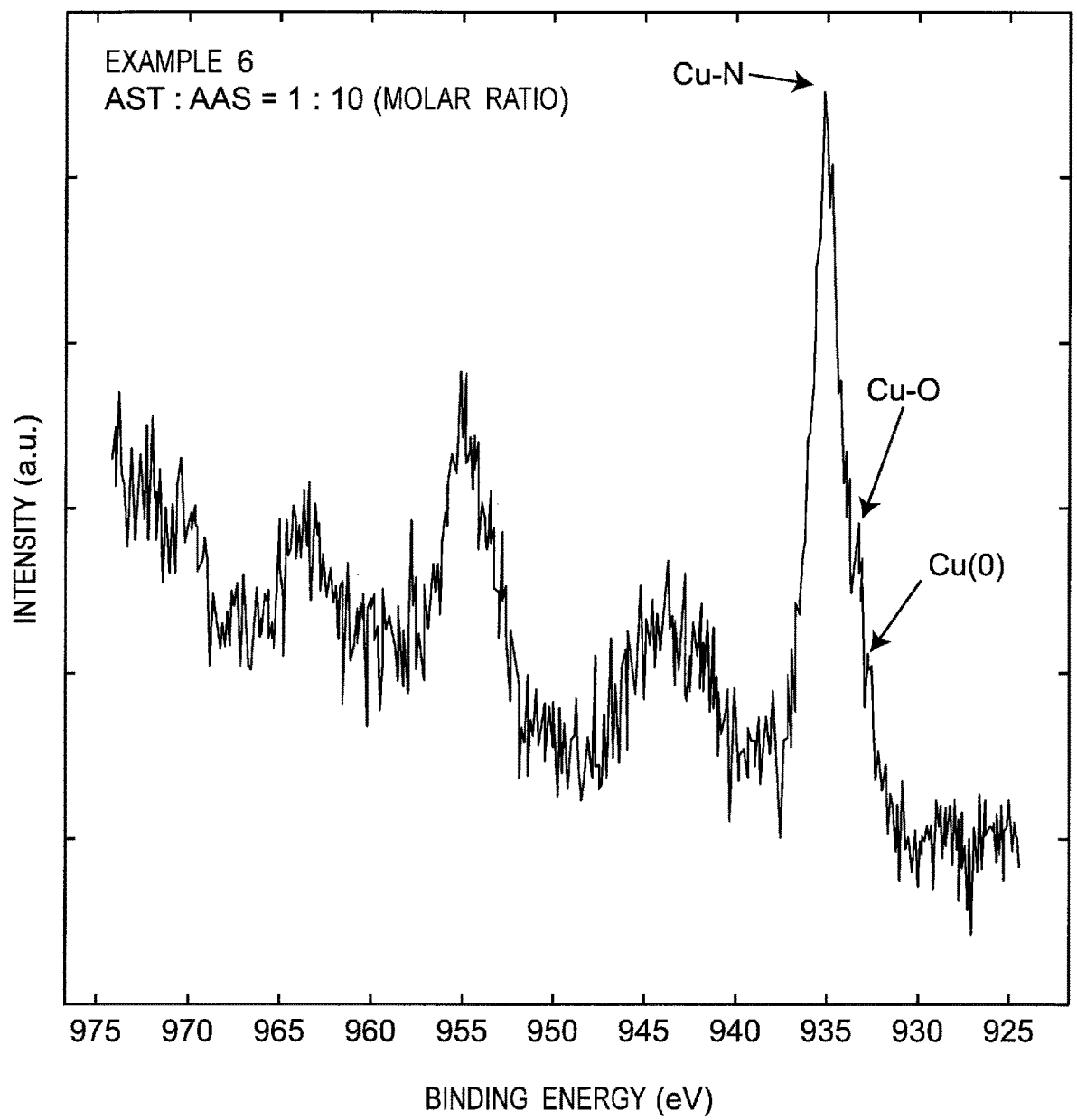
FIG. 12 is an XPS spectrum of a copper foil piece surface coated with an aqueous mixed solution of AST and AAS.

FIG. 12 is an XPS spectrum of a copper foil piece having a compound layer formed by an aqueous mixed solution of AST and AAS (see Table 9) used in Example 6. A molar ratio of AST to AAS in the mixed aqueous solution used is 1:10.

In FIG. 12, the peak intensity of Cu—O and Cu (0-valent) significantly became lower than that of the Cu—N bond peak, and the Cu (0-valent) peak mostly disappeared. Since the peak of Cu (0-valent) has mostly disappeared, it is judged that the copper foil surface is substantially coated with the compound layer. It can be seen that, since the Cu—O bond peak remarkably decreased, the silanol group, which is not chemically adsorbed on the copper foil surface, exists in a high proportion. That is, a large amount of silanol groups, which can be chemically adsorbed to the ester structure of the resin film, remain.

If the ratio of AAS is further increased, it becomes impossible to obtain the effect of mixing AST and AAS. For example, as shown in Table 9, since the ratio of AAS in the aqueous mixed solution is too high (a molar ratio of AST and AAS is 1:15) in Example 7, the peeling strength remarkably decreased. It is considered that the effect depends exclusively on AAS.

The results of (A) peeling test and (B) XPS analysis (Table 9 and FIGS. 9 to 12) revealed that the effect of improving the peeling strength was obtained when the molar ratio of AST and AAS in the aqueous mixed solution is in a range of 1:0.5 to 1:15, and the effect becomes maximum when the molar ratio is especially 1:10.

It was thus confirmed that a compound layer having a high bonding strength can be formed by mixing the first compound having a bulky cyclic structure with the second compound having a linear structure. It was also confirmed that it becomes possible to particularly effectively utilize a difference in three-dimensional structure between the bulky cyclic structure compound and the linear compound by appropriately adjusting the mixing ratio of these compounds, thus making it possible to optimize the density and structure of chemical adsorption of the compound to the copper foil and the resin film having an ester structure.

In other words, in order to exert the effects of the invention according to the present disclosure to the utmost, it is important to not only mix a plurality of widely used linear silane coupling agents and/or to mix a plurality of bulky compounds, but also to select the compound and to appropriately adjust the mixing ratio.

(C) FT-IR Analysis

The bonding state between the compound layer and the surface of the LCP film was examined.

In the same manner as in the above "(A) peeling test", test pieces (both-side copper clad laminates) of Comparative Examples 4 and 5 and Example 6 were prepared. The obtained copper clad laminate was immersed in an aqueous 30 to 35% ferric chloride solution at a temperature of 60° C. for 5 to 6 minutes to dissolve and remove (wet etching) the copper foil. Thereby, the compound layer formed between the copper foil and the LPC film piece was exposed. After washing with ion exchanged water and drying in an oven at 80° C. for 30 minutes, an LPC test piece (LPC film piece coated with a compound layer) for FT-IR analysis was obtained.

With respect to the LPC test piece for measurement, the surface coated with the compound layer was analyzed by FT-IR. FT-IR analysis was performed by the attenuated total reflection (ATR) method using Fourier transform infrared spectrophotometer FT/IR680 Plus manufactured by JASCO Corporation attached with multiple total reflection measuring apparatus ATR500/M manufactured by JASCO Corporation. Using a Ge prism for the multiple total reflection measuring apparatus, measurement was performed at an incident angle of 45° and a reflection number of 5 times. An FT-IR chart of each LPC test piece is shown in FIGS. 13 to 15.

Figure 13:
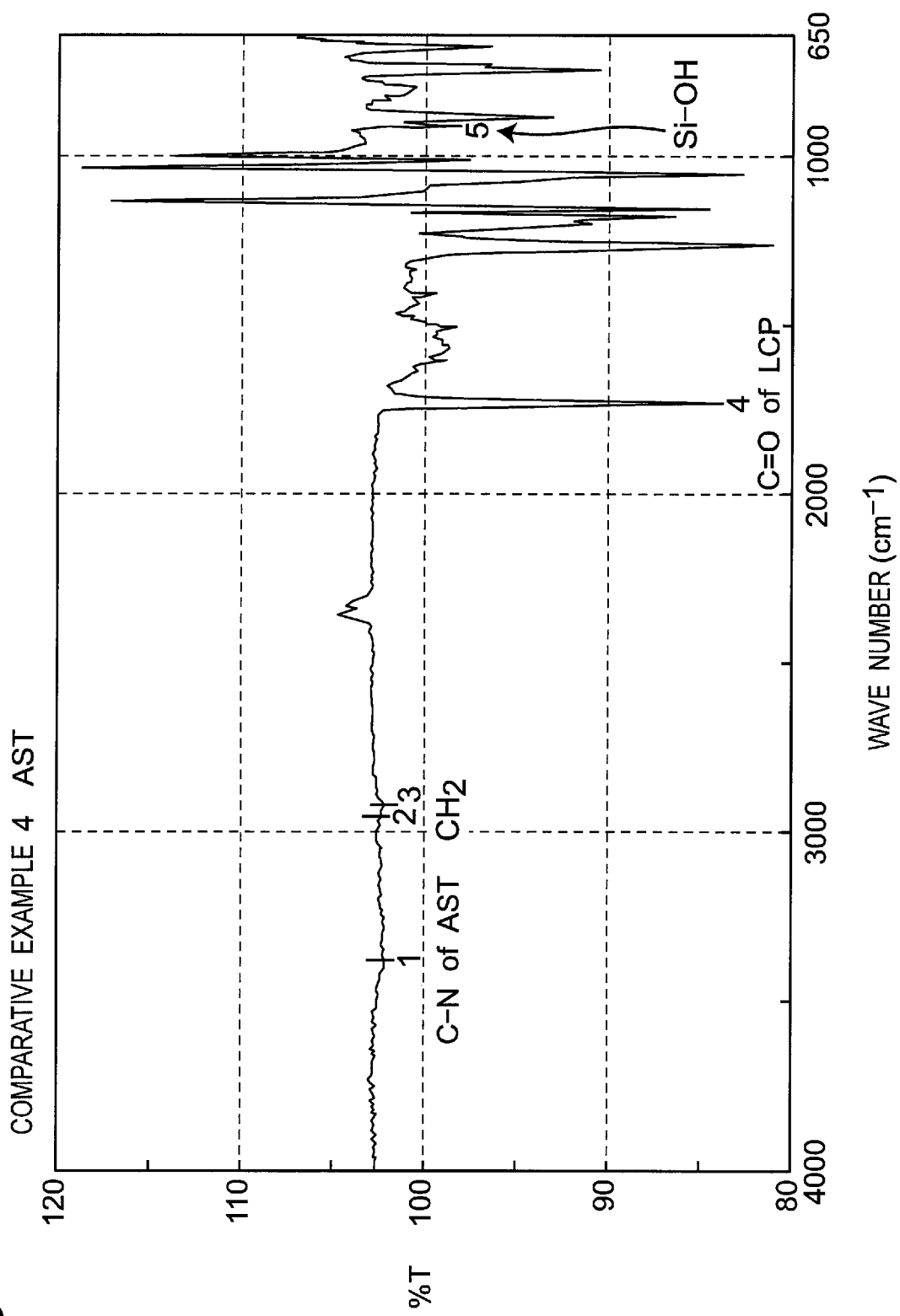
FIG. 13 is an FT-IR chart of an LPC test piece made from a copper clad laminate of Comparative Example 4.

FIG. 13 is an FT-IR chart of the LPC test piece made from the copper clad laminate of Comparative Example 4. A peak (weak broad) of the C—N group of the triazine ring of AST was detected at 3,383 $cm^{-1}$, a peak of the $CH_2$ group peak (weak) was detected at 2,962 $cm^{-1}$ and 2,926 $cm^{-1}$, a peak of the C=O group of the ester group of the LCP film A was detected at 1,735 $cm^{-1}$, and a peak of the Si—OH group of AST was detected at 914 $cm^{-1}$.

Figure 14:
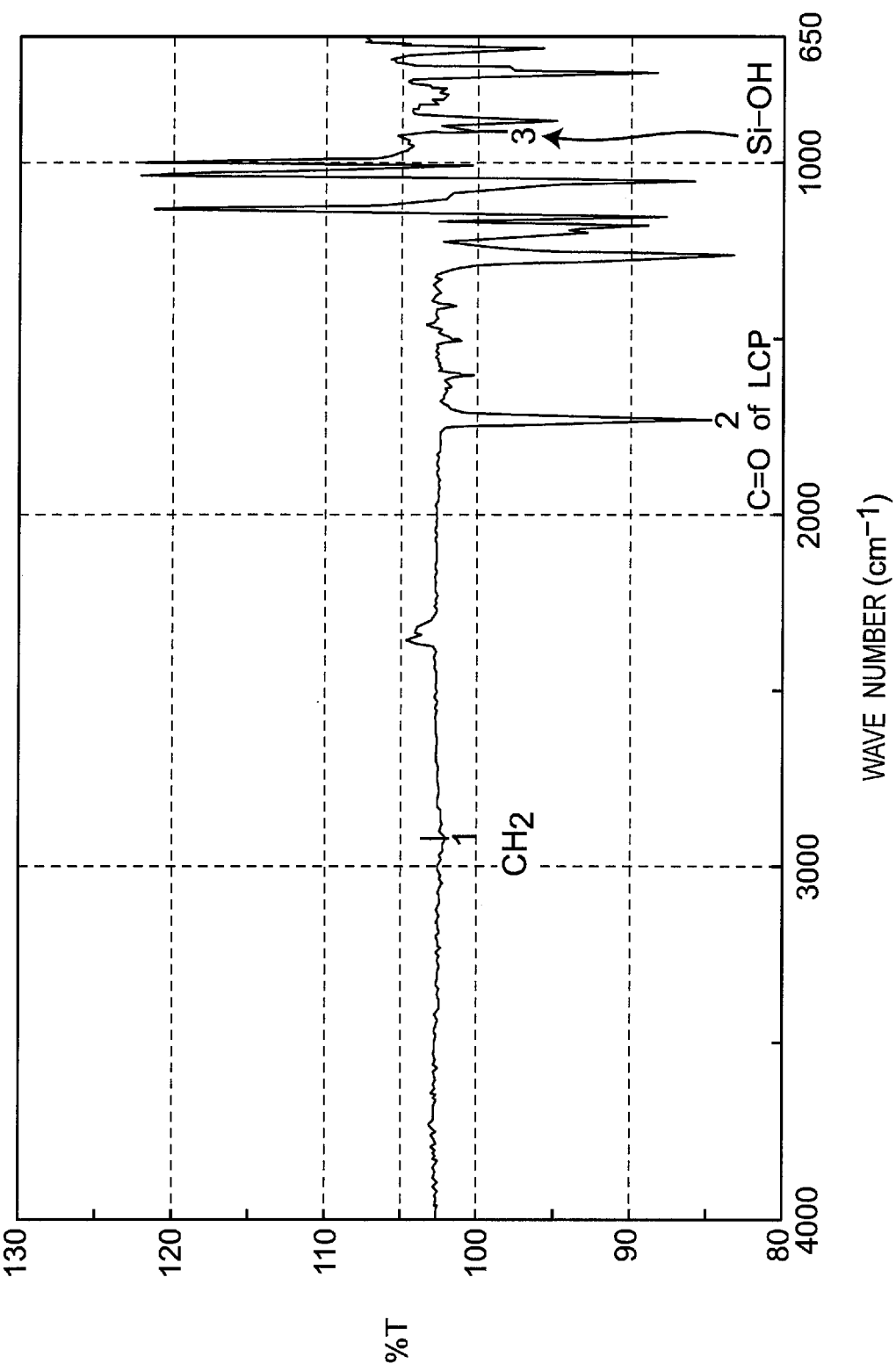
FIG. 14 is an FT-IR chart of an LPC test piece made from a copper clad laminate of Comparative Example 5.

FIG. 14 is an FT-IR chart of the LPC test piece made from the copper clad laminate of Comparative Example 5. A peak (weak) of the $CH_2$ group of AAS was detected at 2,926 $cm^{-1}$, a peak of the C=O group of the ester group of the LCP film was detected at 1,735 $cm^{-1}$, and a peak of the Si—OH group of AAS was detected at 914 $cm^{-1}$.

Figure 15:
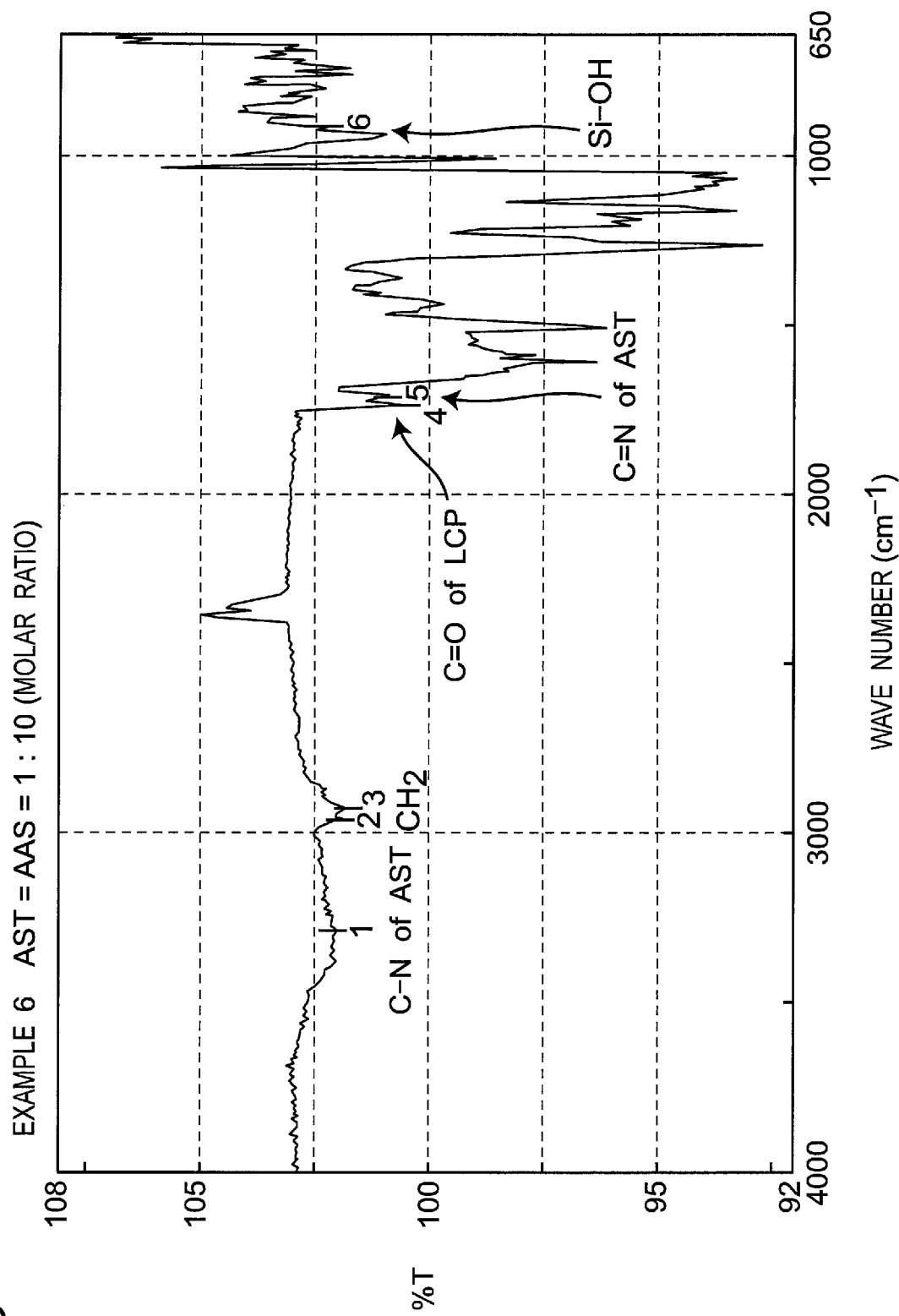
FIG. 15 is an FT-IR chart of an LPC test piece made from a copper clad laminate of Example 6.

FIG. 15 is an FT-IR chart of the LPC test piece made from the copper clad laminate of Example 6. The FT-IR chart of FIG. 15 is largely different from those of FIGS. 13 and 14. A peak of the C—N group of the triazine ring of AST was detected at 3,295 $cm^{-1}$ and a peak of the $CH_2$ group at 2,966 $cm^{-1}$ and 2,926 $cm^{-1}$ are stronger than those of FIGS. 13 and 14. Meanwhile, the peak of the C=O group of the ester group of the LCP film at 1,735 $cm^{-1}$ is weaker than those in FIGS. 13 and 14. A peak of the C=N group of the triazine ring of AST appeared newly at 1,715 $cm^{-1}$. Like FIGS. 13 and 14, a peak of the Si—OH group was detected at 920 $cm^{-1}$.

A consideration is made of the results of FT-IR of FIGS. 13 to 15.

The inventors of the present invention have found that the results of FT-IR are consistent with the results of the peeling test of the copper clad laminate (see Table 9) by interpreting the results of FT-IR as follows. That is, by interpreting as follows, it is possible to logically explain that the peeling strength of each Example is higher than that of each Comparative Example. It is noted that, even if the following interpretation does not match the actual phenomenon, the effects of the invention according to the present disclosure are not denied.

In Comparative Examples 4 and 5, the peeling strength between the copper foil and the LCP film is weak (see Table 9). This is due to insufficient formation of bond between the compound (AST or AAS) and the substrate, especially formation of bond between the compound and the ester structure of the LCP film. Therefore, when the copper foil was wet-etched to prepare an LPC test piece for FT-IR analysis, a part of the compound layer disposed between the copper foil and the LCP film was removed. That is, in the LPC test piece, the surface of the LCP film was partially exposed from the compound layer. As a result, a peak of the C=O group of the ester group of the LCP film at 1,735 $cm^{-1}$ appeared largely in the FT-IR chart of FIGS. 13 and 14.

Meanwhile, in Example 6, since an aqueous mixed solution of AST and AAS was used, a sufficient bond (high-density bond) was formed between the compound and the ester structure of the LCP film. Therefore, when the copper foil was wet-etched, the compound was not removed. That is, the LPC test piece was coated with the compound layer. As a result, in the FT-IR chart of FIG. 15, a peak of the C=O group of the ester group of the LCP film at 1,735 $cm^{-1}$ became smaller. A peak of the C=N group of the triazine ring of AST at 1,715 $cm^{-1}$ appeared clearly (this peak did not appear in Comparative Example 4 (FIG. 13) using AST). As compared with the FT-IR chart of FIGS. 13 and 14, in the FT-IR chart of FIG. 15, a peak of the C—N group of the triazine ring of AST at 3,295 $cm^{-1}$ derived from the compound and peaks at 2,966 $cm^{-1}$ and 2,926 $cm^{-1}$ of the $CH_2$ group became stronger.

The results of (C) FT-IR analysis (FIGS. 13 to 15) revealed that the peel strength of the copper clad laminate is estimated in the copper clad laminate produced by bonding the copper foil piece and the LCP film piece to each other through the compound layer interposed therebetween. It was also found that it is possible to specify or estimate the type (one or plural types) of the compound that forms the compound layer by examining the position and intensity of the peak of the FT-IR chart in detail.

As mentioned above, it was possible to firmly bond the copper metal substrate and the polyester-based resin member to each other by compositely adding alkane type amine-based silane coupling agents to the compound having a nitrogen atom-containing cyclic molecular structure.

This application claims priority based on Japanese Patent Application No. 2016-013477 filed on Jan. 27, 2016, the disclosure of which is incorporated by reference herein.

DESCRIPTION OF REFERENCE NUMERALS

3 Copper alloy article
10 Copper alloy substrate
15 Copper alloy member
20 Compound layer
40 Polyester-based resin body
47 Polyester-based resin member
50 Hydrogen peroxide solution

The invention claimed is:
1. A copper alloy article comprising:
a substrate made of a copper alloy;
a polyester-based resin body; and
a compound layer for bonding the substrate and the polyester-based resin body, wherein
the compound layer consists of;
  (a) a first compound which is a compound having a nitrogen-containing functional group and a silanol group, and
  (b) a second compound which is an alkane type amine-based silane coupling agent, wherein
the first compound is selected from the group consisting of 2-(3-Triethoxysilylpropyl)amino-4,6-di(2-aminoethyl)amino-1,3,5-triazine (AST), Imidazole-based silane compound (ImS), AST analogous compounds and imidazole silane coupling agents, wherein
the AST analogous compounds is selected from the group consisting of compounds in which a triethoxy group of AST is substituted with a trimethoxy group, and compounds in which an amino substituent of a 4,6-di(2-aminoethyl)amino group of AST is substituted with an N-2-(aminoethyl)-3-aminopropyl group, a 3-aminopropyl group, an N-(1,3-dimethyl-methylidyne)propylamino group, an N-phenyl-3-aminopropyl group, an N-(vinylbenzyl)-2-aminoethyl-3-aminopropyl group or a 3-ureidopropyl group, wherein
the imidazole silane coupling agents is selected from the group consisting of compounds having any one of a 1-imidazolyl group, a 3-imidazolyl group and a 4-imidazolyl group, together with a trialkoxysilyl group, and, wherein a peeling strength of the copper alloy article is 0.4 kN/m or more.

2. The copper alloy article according to claim 1, wherein the first compound is AST or AST analogous compounds.

3. The copper alloy article according to claim 1, wherein the substrate has a surface roughness Ra of 0.1 μm or less.

4. The copper alloy article according to claim 1, wherein the polyester-based resin body is made of a polyester-based resin selected from the group consisting of polyethylene terephthalate, polymethylene terephthalate, polybutylene terephthalate, polyethylene naphthalate, polybutylene naphthalate and a liquid crystal polymer.

5. The copper alloy article according to claim 1, wherein an oxide layer and a rust preventive layer are absent on a surface of the substrate.

6. A copper alloy member comprising:
a substrate made of a copper alloy; and
a compound layer provided on a surface of the substrate for bonding the substrate made of the copper alloy and a polyester-based resin body, wherein
the compound layer consists of;
(a) a first compound which is a compound having a nitrogen-containing functional group and a silanol group, and
(b) a second compound which is an alkane type amine-based silane coupling agent, wherein
the first compound is selected from the group consisting of 2-(3-Triethoxysilylpropyl)amino-4,6-di(2-aminoethyl)amino-1,3,5-triazine (AST), Imidazole-based silane compound (ImS), AST analogous compounds and imidazole silane coupling agents, wherein
the AST analogous compounds is selected from the group consisting of compounds in which a triethoxy group of AST is substituted with a trimethoxy group, and compounds in which an amino substituent of a 4,6-di(2-aminoethyl)amino group of AST is substituted with an N-2-(aminoethyl)-3-aminopropyl group, a 3-aminopropyl group, an N-(1,3-dimethyl-methylidyne)propylamino group, an N-phenyl-3-aminopropyl group, an N-(vinylbenzyl)-2-aminoethyl-3-aminopropyl group or a 3-ureidopropyl group, wherein
the imidazole silane coupling agents is selected from the group consisting of compounds having any one of a 1-imidazolyl group, a 3-imidazolyl group and a 4-imidazolyl group, together with a trialkoxysilyl group.

7. The copper alloy member according to claim 6, wherein the first compound is AST or AST analogous compounds.

8. A method for producing a copper alloy member comprising; a substrate made of a copper alloy, and a compound layer provided on a surface of the substrate for bonding the substrate made of the copper alloy and a polyester-based resin body, the method comprising:
cleaning the substrate with an aqueous acid solution; and
bringing a solution into contact with a surface of the substrate, the solution containing; a first compound which is a compound having a nitrogen-containing functional group and a silanol group, and a second compound which is an alkane type amine-based silane coupling agent; and then
heat-treating the substrate, wherein
the first compound is selected from the group consisting of 2-(3-Triethoxysilylpropyl)amino-4,6-di(2-aminoethyl)amino-1,3,5-triazine (AST), Imidazole-based silane compound (ImS), AST analogous compounds and imidazole silane coupling agents, wherein
the AST analogous compounds is selected from the group consisting of compounds in which a triethoxy group of AST is substituted with a trimethoxy group, and compounds in which an amino substituent of a 4,6-di(2-aminoethyl)amino group of AST is substituted with an N-2-(aminoethyl)-3-aminopropyl group, a 3-aminopropyl group, an N-(1,3-dimethyl-methylidyne)propylamino group, an N-phenyl-3-aminopropyl group, an N-(vinylbenzyl)-2-aminoethyl-3-aminopropyl group or a 3-ureidopropyl group, wherein
the imidazole silane coupling agents is selected from the group consisting of compounds having any one of a 1-imidazolyl group, a 3-imidazolyl group and a 4-imidazolyl group, together with a trialkoxysilyl group, wherein the compound layer consists of the first compound and the second compound.

9. A method for producing a copper alloy article comprising; a substrate made of a copper alloy, a polyester-based resin body, and a compound layer for bonding the substrate and the polyester-based resin body, the method comprising:
obtaining a copper alloy member by the method according to claim 8; and
bonding the substrate and the polyester-based resin body by bonding the compound layer and the polyester-based resin body.

10. The method according claim 8, wherein the first compound is AST or AST analogous compounds.

11. The method according claim 9, wherein the first compound is AST or AST analogous compounds.

12. The method according to claim 8, wherein a molar concentration ratio of the first compound to the second compound in the solution is 1:0.5 to 1:15.

13. The method according to claim 9, wherein a molar concentration ratio of the first compound to the second compound in the solution is 1:0.5 to 1:15.

* * * * *